United States Patent [19]

Ranganathan et al.

[11] Patent Number: 5,179,378

[45] Date of Patent: Jan. 12, 1993

[54] METHOD AND APPARATUS FOR THE COMPRESSION AND DECOMPRESSION OF DATA USING LEMPEL-ZIV BASED TECHNIQUES

[75] Inventors: N. Ranganathan, Tampa; Selwyn Henriques, Apopka, both of Fla.

[73] Assignee: University of South Florida, Tampa, Fla.

[21] Appl. No.: 738,121

[22] Filed: Jul. 30, 1991

[51] Int. Cl.⁵ .............................................. H03M 7/38
[52] U.S. Cl. ......................................... 341/51; 341/67
[58] Field of Search .............................. 341/51, 65, 67

[56] References Cited

U.S. PATENT DOCUMENTS

| | | | |
|---|---|---|---|
| 3,560,930 | 2/1971 | Howard | 340/146 |
| 3,852,720 | 12/1974 | Park | 340/172 |
| 4,003,023 | 1/1977 | Benson et al. | 340/146 |
| 4,225,885 | 9/1980 | Lux et al. | 340/146 |
| 4,229,768 | 10/1980 | Kurahayashi et al. | 358/261 |
| 4,464,650 | 8/1984 | Eastman et al. | 341/51 |
| 4,558,302 | 12/1985 | Welch | 341/51 |
| 4,563,671 | 1/1986 | Lim et al. | 340/347 |
| 4,601,055 | 7/1986 | Kent | 382/49 |
| 4,616,211 | 10/1986 | Ross et al. | 341/67 |
| 4,626,829 | 12/1986 | Hauck | 340/347 |
| 4,837,571 | 6/1989 | Lutz | 341/67 |
| 4,851,999 | 7/1989 | Moriyama | 364/401 |
| 4,853,696 | 8/1989 | Mukherjee | 341/65 |
| 4,857,999 | 8/1989 | Welsh | 358/84 |
| 4,876,541 | 10/1989 | Storer | 341/51 |
| 4,881,075 | 11/1989 | Weng | 341/87 |
| 4,951,220 | 8/1990 | Ramacher et al. | 364/488 |
| 4,982,439 | 1/1991 | Castelaz | 382/42 |
| 5,003,307 | 3/1991 | Whiting et al. | 341/51 |
| 5,058,137 | 10/1991 | Shah | 341/51 X |

OTHER PUBLICATIONS

"A Technique for High Performance Data Compression" Computer vol. 17 No. 6, 1984, pp. 8-19.
Ziv, J. & Lempel A. "Compression of Individual Sequences Via Variable Rate Coding" IEEE Trans on Info Theory; vol. IT-24, No. 5, 1978 pp. 530-536.
Ziv, J. & Lempel A. "A Universal Algorithm for Sequential Data Compression"; IEEE Trans on Info Theory; vol. IT-23, No. 5, 1977 pp. 337-343.
Lee, R. "Text Compression with An Associative Parallel Processor" The Computer Journal; vol. 21 No. 1 1978.

Primary Examiner—Marc Hoff
Attorney, Agent, or Firm—Calfee, Halter & Griswold

[57] ABSTRACT

A method and apparatus for compressing and decompressing text and image data by forming fixed-length codewords from a variable number of data symbols. Data symbols are shifted into registers in the first half of a buffer, while an uncompressed string of data symbols are shifted into registers in the second half of the buffer. A systolic array of processors compares each data symbol in the second half of the buffer with each data symbol in the first half of the buffer. Each processor compares pairs of data symbols, and selectively passes the data symbols to an adjacent processor. A fixed-length output is provided indicating the length and the starting point of the longest substring in the first half of the buffer that matches a substring from the second half of the buffer. The matched data symbols in the second half of the buffer and the data symbol immediately following the matched data symbols are then shifted into the first half of the buffer, and uncompressed data symbols are then shifted into the second half of the buffer. A preselected shift register in the first half of the buffer provides a fixed-length output indicating the symbol that immediately follows the last matched data symbol. The length and the starting point information and the last symbol information are assembled to form a codeword having a predetermined length. The codeword is stored in memory and can be later retrieved and decompressed to provide the original string of data symbols.

31 Claims, 9 Drawing Sheets

| TIME UNITS | PROCESSOR 28a | PROCESSOR 28b | PROCESSOR 28c | PROCESSOR 28d | OUTPUT |
|---|---|---|---|---|---|
| 1 | x1−y1 | | | | |
| 2 | x2−y2 | | | | |
| 3 | x3−y3 | x2−y1 | | | |
| 4 | x4−z<br>lgt−max | x3−y2 | | | |
| 5 | y1−z | x4−y3 | x3−y1 | | |
| 6 | y2−z | y1−z<br>lgt−max | x4−y2 | | |
| 7 | | y2−z | y1−y3 | x4−y1 | |
| 8 | | | y2−z<br>lgt−max | y1−y2 | |
| 9 | | | | y2−y3 | |
| 10 | | | | lgt−max | |
| 11 | | | | | |
| 12 | | | | | out |

| R | S | Q |
|---|---|---|
| 0 | 0 | INVALID |
| 0 | 1 | 0 |
| 1 | 0 | 1 |
| 1 | 1 | Qt−1 |

| $a6-i$ | $b6-i$ | $c_i$ | $d_i$ | $c_{i+1}$ | $d_{i+1}$ | STATE |
|---|---|---|---|---|---|---|
| 0 | 0 | 0 | 1 | 0 | 1 | A=B |
| 0 | 1 | 0 | 1 | 0 | 0 | A<B |
| 1 | 0 | 0 | 1 | 1 | 1 | A>B |
| 1 | 1 | 0 | 1 | 0 | 1 | A=B |
| X | X | 0 | 0 | 0 | 0 | A<B |
| X | X | 1 | 1 | 1 | 1 | A>B |

Fig.9

| NAME OF THE FILE | SIZE OF THE FILE | % COMP BUFFER SIZE 256 | % COMP BUFFER SIZE 16 | % COMP BUFFER SIZE 32768 |
|---|---|---|---|---|
| FILE1 | 204325 | 63.60 | 58.1 | 64.63 |
| FILE2 | 102448 | 34.02 | 16.48 | 46.06 |
| FILE3 | 516096 | 81.05 | 78.63 | 92.81 |
| FILE4 | 394649 | 69.12 | 53.23 | 75.29 |
| FILE5 | 45241 | 40.49 | 38.99 | 40.09 |
| FILE6 | 39250 | 43.89 | 17.69 | 12.51 |

Fig.10

| SIZE OF THE ORIGINAL FILE | HUFFMAN CODING % COMPRESSION | LZ ALGORITHM % COMPRESSION | MODIFIED LZ ALGORITHM % COMPRESSION |
|---|---|---|---|
| 3337 | 39.69 | 27 | 48 |
| 4173 | 21.65 | 24.9 | 45.9 |
| 36946 | 32.03 | 54 | 64.9 |
| 29455* | 29.89 | 1.1 | 22.5 |
| 28462 | 12.21 | 67.4 | 74.7 |
| 7579 | 27.30 | 19.8 | 38.3 |
| 20610 | 35.13 | 39.7 | 54.3 |
| 1785 | 31.80 | 57.1 | 61.8 |

\* The file contains very few similar strings.

Fig.11

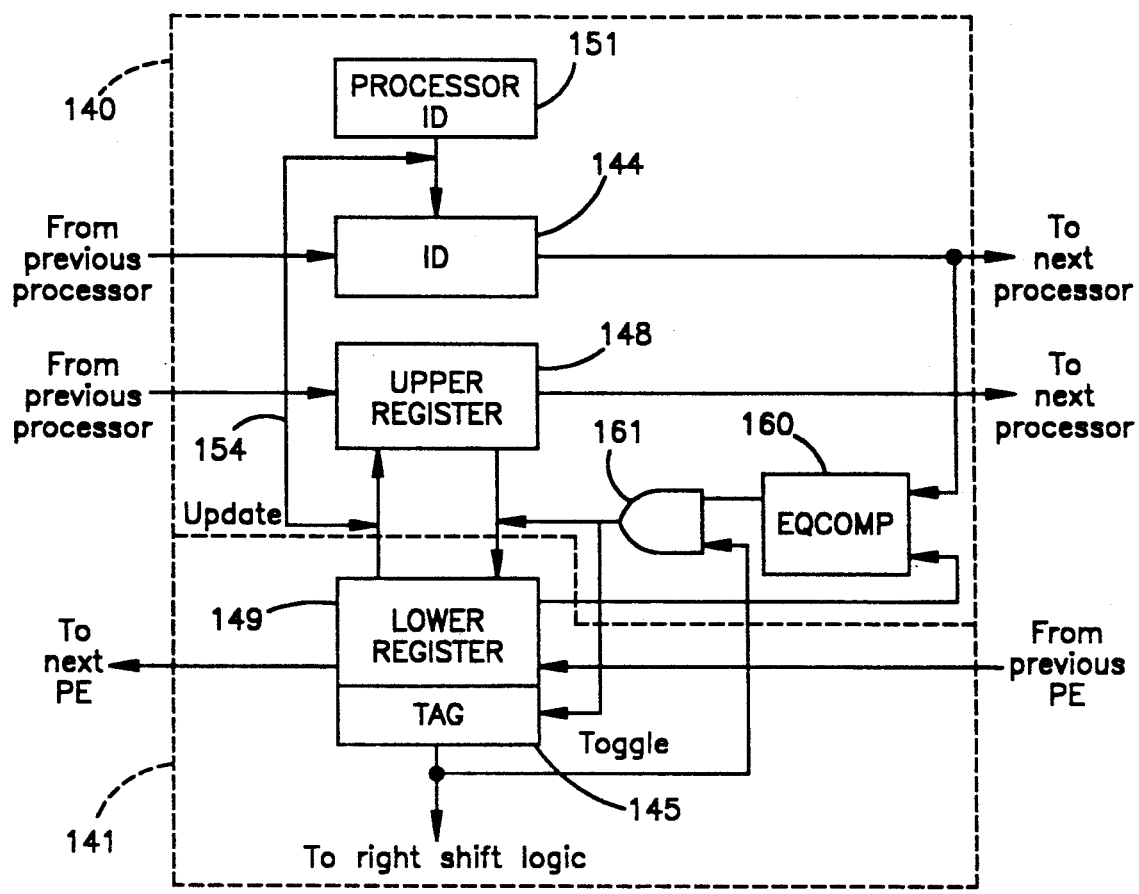

Fig.20

|  | 0 | 1 | 2 | 3 | 4 | 5 | 6 | 7 | 8 |
|---|---|---|---|---|---|---|---|---|---|
| Upper buffer | 0 | 0 | 0 | 0 | 0 | 0 | 1 | 0 | 2 | —140
| Lower buffer | 0 | 0 | 0 | 1 | 0 | 2 | 1 | 0 | 2 | —141

Fig.21

|  | 0 | 1 | 2 | 3 | 4 | 5 | 6 | 7 | 8 |
|---|---|---|---|---|---|---|---|---|---|
| Upper buffer | 0 | 0 | 0 | 0 | 0 | 0 | 1 | 0 | 2 | —140
| Lower buffer | 0 | 1 | 0 | 2 | 1 | 0 | 2 | 0/6 | 1 | —141

Fig.22

|  | 0 | 1 | 2 | 3 | 4 | 5 | 6 | 7 |
|---|---|---|---|---|---|---|---|---|
| Upper buffer | 0 | 0 | 0 | 0 | 0 | 0 | 0 | 1 | 0 | —140
| Lower buffer | 0 | 1 | 0 | 2 | 1 | 0 | 2 | 0/6 | 1 | —141

Fig.23

|  | 0 | 1 | 2 | 3 | 4 | 5 | 6 | 7 |
|---|---|---|---|---|---|---|---|---|
| Upper buffer | 0 | 1 | 0 | 2 | 1 | 0 | 2 | 1 | 1 | —140
| Lower buffer | 0 | 1 | 0 | 2 | 1 | 0 | 2 | 1 | 1 | —141

METHOD AND APPARATUS FOR THE COMPRESSION AND DECOMPRESSION OF DATA USING LEMPEL-ZIV BASED TECHNIQUES

FIELD OF THE INVENTION

The present invention relates to a method and apparatus for compressing and decompressing data, and more particularly to a method and apparatus for providing on-line, lossless compression and decompression of text and/or image data using Lempel-Ziv based techniques.

BACKGROUND OF THE INVENTION

With the advancement of computer technology, large scale information transfer by remote computing and the development of massive information storage and retrieval systems have witnessed a tremendous growth. The growth of these systems has created a need for efficient mechanisms for the storage and transfer of enormous volumes of data. Accordingly, data compression and decompression techniques have been developed which reduce the redundancy in data representation in order to decrease data storage requirements and data transfer costs. In particular, the data compression techniques transform a body of data into a smaller form from which the original, or some approximation of the original, can be recovered at a later time. There are at least two types of data compression: (1) "lossless" data compression, where the data that is compressed and subsequently decompressed is identical to the original data; and (2) "lossy" data compression, where the decompressed data is some approximation of the original data. The present invention is primarily directed to the former, lossless, data compression technique.

Several data compression algorithms of different philosophy, complexity and application scope have been developed to reduce the redundancy in data representation. Such algorithms include: (i) the Huffman method, (ii) the adaptive Huffman method, (iii) the multi-group compression method, (iv) run-length encoding, (v) the header compression method, (vi) the LZW algorithm, (vii) arithmetic coding, and (viii) dictionary-based methods. Further, a technique for enhancing the arithmetic and Huffman coding methods has been proposed by the inventors of the present invention. (See Bassiouni, M., Mukherjee, A., and Ranganathan, N. "Enhancing Arithmetic and Tree-Based Coding" Journal of Information Processing and Management, Vol. 25, No. 1, 1989).

One particularly useful algorithm for the compression and decompression of text and/or image data has been proposed by Lempel and Ziv in 1977 (hereinafter the "LZ" technique). A brief discussion of the technique follows, and for the purposes of this invention, the following terminology is defined: An "alphabet" is a finite set containing at least one element. The elements of an alphabet are called "characters" or "symbols". A "string" over an alphabet is a sequence of characters, each of which is an element of that alphabet. All strings are assumed to be of finite length unless otherwise stated. A "substring" is a part of a string. This term is generally used to denote the part of the string that matched. The degree of data reduction obtained as a result of the compression is the "compression ratio". This ratio measures the quantity of compressed data in comparison to the quantity of the original data and is given by:

$$\text{Compression ratio} = \frac{\text{Length of the original data string}}{\text{Length of the compressed data string}}$$

Percentage compression (% compression) gives an estimate of how much compression is achieved. It is given by:

$$\% \text{ Compression} = 1 - \frac{\text{Length of the compressed data string}}{\text{Length of the original data string}} \cdot 100$$

The LZ technique proposed by Lempel and Ziv for data compression involves two basic steps: (i) parsing and (ii) coding. In the "parsing" step, a string of symbols is split into substrings of variable length according to certain rules. In the "coding" step, each substring is coded sequentially into a fixed length code. A mathematical discussion of the technique is described in Ziv, J. and Lempel, A., "A Universal Algorithm for Sequential Data Compression" IEEE Trans. on Info Theory, Vol. IT-23, No. 5, 1977 p. 337-343; and Ziv, J. and Lempel, A. "Compression of Individual Sequences via Variable Rate Coding" IEEE Trans. on Info Theory, Vol. IT-24, No. 1978 pp. 530-536.

According to the LZ technique, a buffer of a preselected length is chosen, for example a buffer of length 18. The first half of the buffer contains the symbols already coded, and the second half contains the symbols that are yet to be coded. An alphabet set of a preselected number of symbols can be used, i.e., 0, 1 and 2; and let "S" be the string to be compressed. For the purposes of this example, let S=0102102110102102112.

I. The Compression Process

The first half of the buffer is initialized to contain all zeros at the beginning of the compression phase. The second half of the buffer is filled with the first 9 symbols of the string to be compressed. Accordingly, the buffer contains:

000000000 010210211

A blank space in the above string separates the first half of the buffer from the second half. Let s represent the first symbol in the second half of the buffer. Here, s=0. A match is found in the first half of the buffer for a string starting with s. The information that is required when a match is found is as follows:
i) The length of the match;
ii) Starting position of the matched string in the first half of the buffer; and
iii) The first symbol in the second half immediately after the matched string.

In the above state of the buffer, the longest match is the symbol '0'. The length $\underline{L}$ of the match is 1. The match occurs at all 9 positions numbered 0-8 in the first half. For reasons that will be evident later, the last position where the match occurs is chosen. In this case, the position is 8. This position of the longest match is called the pointer and is denoted by $\underline{P}$. The symbol in the second half following the match is called the lastsymbol and is in this case. The codeword is formed from this information. The codeword is given by $\underline{P}.\underline{L}.\text{lastsymbol}$ where '.' represents concatenation.

The maximum value of both $\underline{P}$ and $\underline{L}$ in the example is 8. The codewords are represented using the symbols 0, 1 and 2, since they are the only symbols in the alphabet. Further, since the cardinality of the alphabet is 3, the quantities $\underline{L}$ and $\underline{P}$, each will require two symbols for representation. This is because the maximum value possible for $\underline{L}$ or $\underline{P}$ is 8 and $1n_38=2$. Therefore, the length of the codeword is $2+2+1=5$. The first codeword would be 22011.

Two symbols have been coded so far, i.e., 01. Therefore, the contents of the buffer are shifted left by two positions so that these two symbols get into the first half of the buffer. The next two symbols of the string are shifted in. The buffer now contains:

000000001 021021101

There is only one matching symbol at this point, which is 0. Therefore, $\underline{P}=7$, $\underline{L}=1$ and $\underline{\text{lastsymbol}}=2$, and the codeword is 21012. Since the symbols that are coded are 02, the contents of the buffer are shifted two positions to the left and two new symbols of the string are taken in. The buffer then becomes:

000000102 102110102

Here, $\underline{P}=6$, $\underline{L}=4$ and the $\underline{\text{lastsymbol}}=1$. The codeword is therefore 20111. The symbols that are coded are 10211. The contents of the buffer are shifted left by 5 positions and another 5 symbols are shifted in so that the buffer becomes:

010210211 010210212

Here, $\underline{P}=0$, $\underline{L}=8$ and the $\underline{\text{lastsymbol}}$ is 2, so that the codeword is 00222. The compression process continues as described.

The above-described compression algorithm can be summarized as follows:
1. Initialization: The first half of the buffer is filled with zeros and the second half filled with the first n symbols of the string. The size of the buffer is 2n.
2. Parsing: The longest substring of a string starting at s in the second half of the buffer that matches a substring in the first half of the buffer is found.
3. Coding: The pointer $\underline{P}$, the length $\underline{L}$, and the $\underline{\text{last symbol}}$ that are found from the previous step are coded.
4. Updating: The contents of the buffer are updated after each parsing and coding operation. $\underline{L}+1$ symbols occupying the first $\underline{L}+1$ positions of the buffer are shifted out while feeding in the next $\underline{L}+1$ symbols from the source.

II. The Decompression Process

Decompression can be achieved by reversing the compression process. If $\underline{B}$ is the length of the first half of the buffer that was used in compression, then a buffer of length $\underline{B}$ is used to store the most recently decoded symbols. The locations in the buffer are marked 0 to $\underline{B}-1$, left to right. Initially the buffer is loaded with zeros. This conforms to initializing the buffer to all zeros as was done during compression. The pointer $\underline{P}$ and the length $\underline{L}$ are obtained from the first codeword. $\underline{L}$ left shifts are applied while feeding the contents of the location $\underline{P}$ of the buffer into the last position in the buffer. After the $\underline{L}$ shifts, one more shift is applied while feeding the $\underline{\text{lastsymbol}}$ from the codeword into the last position of the buffer. Each symbol that is shifted out of the buffer is part of the decompressed string. Note that the first $\underline{B}$ symbols are zeros which were used to initialize the buffer and hence do not form a part of the decompressed string. The sequence of steps can be continued until the last codeword. After the last codeword, $\underline{B}$ shifts are applied to shift out the last $\underline{B}$ decoded symbols.

The process of decompression is illustrated in the following example. Let the codewords to be decompressed be the codewords formed during the compression example described above, i.e., 22011, 21012, 20111 and 00222.

The buffer locations are initially loaded with 0's. From the first codeword, the value of pointer $\underline{P}$ is $(22)_3$, that is 8, length $\underline{L}$ is $(01_3$, that is 1, and the $\underline{\text{lastsymbol}}$ is 1. As discussed earlier, $\underline{L}$ left shifts are applied while feeding the contents of the location pointed to by $\underline{P}$ into the last location of the buffer. After these $\underline{L}$ shifts, yet another shift is applied while shifting the $\underline{\text{lastsymbol}}$ into the last location of the buffer. The symbols shifted out at the left are the decoded symbols. The first symbol is thereby decoded. Similarly the second, third and the fourth symbols are subsequently decoded.

The first 9 symbols that are shifted out are ignored since they represent the 0's that are used to fill the buffer initially. After decoding all codewords, the 9 symbols that remain in the buffer are shifted out. The shifted out symbols form the original string, i.e., 010210211010210212.

Many variations of the above-described algorithm have been used in practice primarily through software implementations — which it is believed do not meet the projected speed and performance requirements of future systems.

A few paper designs using associative memory, microcode memory and microprocessor-based systems have been reported (see e.g., Lea, R. "Text Compression With an Associative Parallel Processors", The Computer Journal, Vol. 21, No. 1, 1978). Additionally, a set of parallel algorithms for compression by textual substitution has also been proposed (see Gonzalez-Smith M. and Storer, J. "Parallel Algorithms for Data Compression" JACM, Vol. 32, No. 2, Apr., 1985, pp. 344–373). Further, a complex hardware design for the LZW algorithm using hash tables is briefly discussed in Welch, "A Technique for High-Performance Data Compression" Computer, Vol. 17, No. 6, 1984, pp. 148–152. Finally, a set of hardware algorithms for static compression methods like Huffman, multigroup technique and run-length compression methods has been proposed in Mukherjee, A., Ranganathan and N. Bassiouni, M., "Adaptive and Pipelined VLSI Designs for Data Transformation of Tree-Based Codes" IEEE Trans. on Circuits and Systems Vol. 38, No. 3, 1991.

Additionally, a hardware compression/decompression technique is shown in Storer, U.S. Pat. No. 4,876,541. The Storer patent implements a variation of the Lempel-Ziv technique. The '541 patent describes a compression phase which maintains a dictionary of strings which have occurred earlier in the text and a pointer which is associated with each such stored string. Whenever a string in the current text being compressed matches with a string in the dictionary, the string is replaced with the pointer. The dictionary is therefore a table of frequently appearing strings of characters. Storer's technique has a time complexity of O(nlogn), where n is the number of processors which perform the comparison between the strings.

The dictionary in the Storer patent is stored in semiconductor memory (64K dynamic memory and 32K ROM). The size of the dictionary depends on the amount of memory used to store the table. The dictionary is adapted to contain a finite number of entries. However, the larger the size of the memory, the greater the memory access times will be, which results in slower throughputs. In their paper, Gonzalez-Smith, M. and Storer, J. "Parallel Algorithms for Data Compression," JACM, Vol. 32, No. 2, Apr. 1985, pp. 344-373, the authors suggest a dictionary of size 4096 bytes for achieving proper compression.

Another hardware compression/decompression technique is shown in Hauck, U.S. Pat. No. 4,626,829. The Hauck patent illustrates a compression device based on a combination of the run-length encoding and a statistical encoding scheme such as Huffman coding. The run-length method involves replacing repeated occurrences of the character with a single occurrence of the character and the run length. For example, a string "BBBBBCCCCCCC" will be coded as "B5C7", by which a 12 byte data stream is encoded with 4 bytes. The statistical encoding scheme is then used to provide an appropriate code. This method is useful for image data.

Other hardware techniques for compression/decompression of data include Lutz, U.S. Pat. No. 4,837,571, which illustrates a hardware scheme for converting a data signal having codewords of different length and a constant bit rate into an output signal consisting of codewords of constant length and variable bit rate; Kent, U.S. Pat. No. 4,601,055, which illustrates an image processor hardware architecture which can be used for pixel-based image processing tasks such as thresholding, convolution, filtering, arithmetic and logic operations on images; and Howard, U.S. Pat. No. 3,560,930, which illustrates a method and apparatus for reducing data in a pattern recognition system.

Moreover, it is believed that some past research in this direction has focused on designing hardware VLSI techniques for static compression methods which assume fixed probabilities for the frequency of occurrences of various symbols. For example, one hardware compression/decompression technique is shown in Mukherjee, U.S. Pat. No. 4,853,696, which illustrates techniques for implementing compression and decompression based on static Huffman codes. The Huffman coding scheme uses a probability distribution which represents the frequency of occurrence of the various characters of the alphabet set within a file to be decompressed. The Huffman scheme assigns fewer bit codes to more frequently occurring symbols and longer codes to less frequently occurring symbols, thereby reducing the average number of bits per character. For example, the fixed length code in the ASCII set consists of 8-bit codes. By assigning variable length codes, the average number of bits per character can be reduced to four, for a compression ratio of 50%. Accordingly, the Huffman method assigns variable length codes to fixed length characters. The Mukherjee patent describes hardware circuits for implementing the compression/decompression techniques based on the above algorithm.

The static methods such as Huffman coding, however, do not take into account the changing frequency of occurrences, and do not provide single-pass compression and decompression. Since the codes change depending on the changing frequencies during the compression, the static methods can have certain limitations.

SUMMARY

The present invention provides a new and useful method and apparatus for the compression and decompression of data, and in particular for providing on-line, lossless compression and decompression of text and/or image data. The method and apparatus includes hardware implementation of the Lempel-Ziv based data compression technique. Unlike the Huffman method, adaptive Huffman method and run-length encoding, the LZ technique does not depend upon the probabilities of occurrences of symbols; rather the LZ technique takes into account the changing frequency of occurrence of symbols which allows single-pass compression and decompression. The hardware is systolic in nature and has a time complexity of $O(n)$. The hardware can be integrated into real time systems, e.g., located between the RAM in a PC and the hard disk drive, to compress and decompress data on-line The compression hardware includes a buffer having a predetermined number of shift registers. The shift registers in the buffer are organized into a first half and a second half. The registers in the first half of the buffer are initialized by loading the registers with zeros; while uncoded data symbols are shifted into the registers in the second half of the buffer. Each data symbol in the first half of the buffer is compared with each data symbol in the second half of the buffer using a systolic array of parallel processors. Each processor compares pairs of data symbols received from the buffer and selectively passes the data symbols to an adjacent processor during a clock cycle. The systolic array of processors provides a fixed-length output indicating the length and the starting point of the longest substring in the first half of the buffer that matches a substring from the second half of the buffer.

The matched data symbols in the second half of the buffer and the data symbol immediately following the matched data symbols are then shifted into the first half of the buffer and additional uncoded data symbols are shifted into the second half of the buffer. A preselected shift register in the first half of the buffer provides a fixed-length output indicating the data symbol that immediately follows the last matched data symbol. The outputs from the processors and the buffer are shifted into a temporary storage buffer and provide a codeword having a predetermined maximum length. The codeword indicates the length and the starting point of the longest substring, and the symbol immediately after the last matched symbol. The encoding of the data symbols continues until all the symbols are encoded into fixed-length codewords.

Two hardware techniques are provided for decompressing the compressed data. One technique uses semi-systolic architecture which includes parallel processors to decode the codewords. The other technique uses sequential architecture to decode the codewords. Both hardware techniques decompress the codewords at the rate of one byte per clock cycle to recreate the original string of data symbols.

One feature of the present invention is to provide an efficient method of compressing and decompressing data strings using VLSI/WSI hardware techniques which can be integrated on-line into terminals and disk controllers. The front-end machines and host nodes can thereby be relieved from the overhead of compression and decompression.

Another feature of the present invention is to provide a system for the compression and decompression of data using adaptive techniques which take into account the changing frequency of occurrences of characters, thereby resulting in single-pass compression and decompression.

Another feature of the present invention is to provide a system for the compression and decompression of data symbols using a systolic array of parallel processors. The systolic array of processors provide a higher computation throughput and reduce the complexity of the comparisons from $O(n^2)$ to $O(n)$.

Still another feature of the present invention is to provide a compression/decompression system using a modified Lempel-Ziv based data compression technique which compensates for mismatches or matches of only one data symbol during the parsing step.

Further features and advantages of the present invention will become apparent from the following detailed description and accompanying drawings which form a part of the specification.

BRIEF DESCRIPTION OF THE DRAWINGS

FIG. 9 is a truth-table for the lexical comparator illustrated in FIG. 8;

FIG. 10 is a table illustrating the compression efficiency of various sized buffers;

FIG. 11 is a table illustrating the compression efficiency of various compression techniques;

FIG. 16 is a schematic representation of the processor for the semi-systolic architecture of FIG. 15; and FIGS. 17-23 are schematic representations of the buffer for the semi-systolic architecture of FIG. 15 illustrating the data symbols located in selected shift registers in the buffer.

DETAILED DESCRIPTION OF THE PREFERRED EMBODIMENT

Figure 1:
FIG. 1 is a schematic illustration of the compression and decompression process according to the principles of the present invention.

Referring to the drawings, and initially to FIG. 1, a method and apparatus for the compression and decompression of text and/or image data is illustrated. The method and apparatus provide for compressing a variable length string of data symbols (either text or image strings) by encoding the data symbols into fixed-length codewords and storing the codewords in memory e.g., a hard disk drive; and then later decoding the codewords into the original data. The method and apparatus includes hardware implementation of the Lempel-Ziv based data compression technique, and are preferably designed to be incorporated into a VLSI/WSI chip to compress and decompress data on-line.

Figure 2:
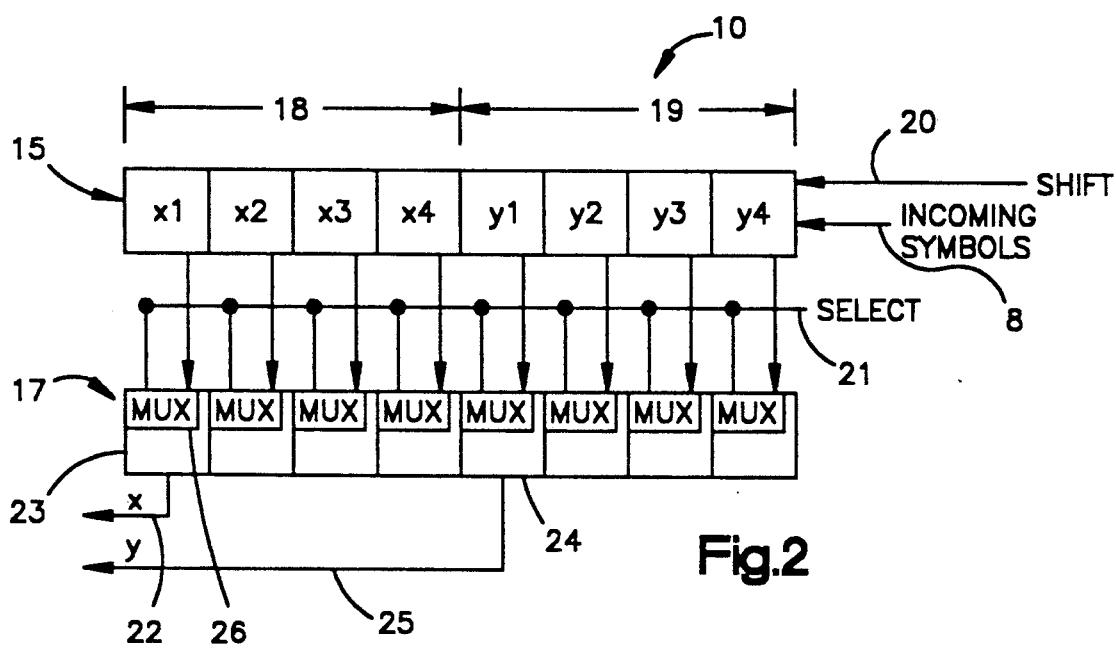
FIG. 2, is a schematic illustration of the buffer for the compression process of FIG. 1.

Referring now to FIG. 2, the incoming data symbols to be compressed are received on bus 8 and are initially stored temporarily in a buffer, indicated generally at 10. The preferred size of the buffer will be described later, however for the purposes of the following example, assume the buffer has a size of 8 bytes. The buffer 10 comprises a series of shift registers, wherein each register has a width of e.g., 8 bits. The registers are divided into an upper level, indicated generally at 15, and a lower level, indicated generally at 17.

The registers in the upper level 15 of the buffer are organized into a first half 18 and a second half 19. For an 8 byte buffer, the register locations in the upper level of the buffer can be identified as $x_1, x_2, X_3, X_4, y_1, y_2, y_3$ and $y_4$, respectively. The shift registers $X_1-X_4$ in the first half 18 of the buffer contain symbols that have already been encoded, while the shift registers $Y_1-Y_4$ in the second half of the buffer receive symbols to be encoded. The symbols are input to the registers from the right and are shifted left when the signal on the "shift" line 20 goes high.

The lower level 17 of the buffer is of the same length as the upper level 15 and is also divided into a first half 18 and second half 19. The contents of the upper level 15 are copied into the lower level 17 when the "select" line 21 goes high. The lower level 17 is used to provide data symbols to the other components on the chip in the correct sequence. Specifically, during each clock cycle, a first "$x_n$" data symbol appears on a 7-bit bus 22 from shift register 23 in the lower level 17; while a second "$y_n$" data symbol appears on a 7-bit bus 25 from shift register 24 in the lower level 17, as described herein in more detail.

Each location in the lower level 17 of the buffer has a multiplexer ("mux") 26. The multiplexer 26 facilitates copying the contents of the upper level to the lower level when the "select" line 21 goes high. Otherwise, the contents of the shift registers in the lower level 17 keep shifting left at each clock cycle when shift line 20 goes high.

According to the data compression technique of the present invention, the symbols in the first half of the buffer are compared to the symbols in the second half of the buffer to determine: i) the length of a matched string; ii) the starting position of the matched string in the first half of the buffer; and iii) the first symbol in the second half of the buffer immediately after the matched string.

A pseudocode for the basic sequential compression technique for a buffer of size 8 is provided below. The pseudocode illustrates the necessary comparisons between the symbols and is useful in understanding the derivation of the present invention.

| Variables | |
|---|---|
| i,j: | indices marking locations in the first |

| Variables | |
|---|---|
| | and second halves of the buffer |
| cur_length: | indicates the number of symbols that are matched so far. |
| max_length: | contains the length of the longest matching substring (that is matched). |
| pointer: | Contains the index of the position in the first half of the buffer where the match commenced. It corresponds to the longest match so far. |
| $x_{index}$: | The $index^{th}$ location in the buffer. |
| $y_j$: | The jth location in the y part of the buffer. |

The Algorithm

Initialization

Locations $x_1$ through $x_4$ are loaded with zeros.
Locations $y_1$ through $y_4$ contain the first 4 symbols of the strings to be coded.

Phase 1

```
maxlength := 0;
pointer := 0;
for i := 1 to 4
    index := i;
    cur_length:= 0;
    for j := 1 to 3
        if (x_index < =4)
            if (x_index = y_j) then cur_length:=cur_length+1
            else break; {exit the "for" loop}
            endif;
        else
            if (y_index-4 = y_j) then cur_length: = cur_length+1
            else break; {exit the "for" loop}
            endif;
        endif;
    endfor;
    if cur_length > maxlength then
        maxlength:= cur_length;
        pointer:= i;
    endif;
endfor.
```

PHASE 2

Pointer and maxlength obtained in Phase 1 are coded along with one symbol following the reproducible extension (i.e., the symbol at location maxlength+1 in the y part of the buffer) as the lastsymbol of the code. The symbols in the buffer are shifted left "maxlength+1" times and maxlength+1 new symbols are shifted in from the right.

Phase 1 and Phase 2 are repeated until the entire string has been compressed.

The following 4 sets of comparisons are done in sequence in order to find a matching substring with maximum length, as can be seen from the pseudocode given above:

| 1. | $x_1$-$y_1$ | $x_2$-$y_2$ | $x_3$-$y_3$ |
|---|---|---|---|
| 2. | $x_2$-$y_1$ | $x_3$-$y_2$ | $x_4$-$y_3$ |
| 3. | $x_3$-$y_1$ | $x_4$-$y_2$ | $y_1$-$y_3$ |
| 4. | $x_4$-$y_1$ | $y_1$-$y_2$ | $y_2$-$y_3$ |

Here '-' indicates an equality comparison between symbols on each side of it. Whichever set succeeds in maximum number of comparisons in a sequence determines the required substring. "In a sequence" implies that if any of the comparisons in a set fails at any time, the succeeding comparisons in that set do not count as successful ones. For example, if $x_1$-$y_1$ was a successful comparison and if $x_2$-$y_2$ was not a successful comparison, then even if $x_3$-$y_3$ were a successful comparison, it would not be counted as successful, so that the length of the substring in that set would be 1.

Figure 3:
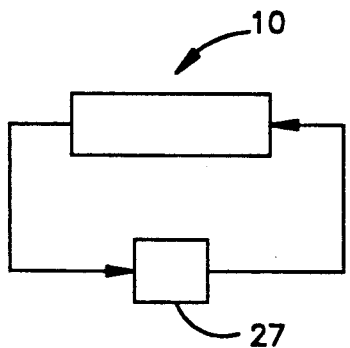
FIG. 3 is a schematic representation of a sequential method for comparing symbols.

To perform these comparisons, the symbols can be loaded sequentially from the buffer 10 into a processor, for example as indicated at 27 in FIG. 3. The processor 27 can be configured to perform each comparison in sequence. However, for such a processor, 12 time units are required, or $n(n-1)$ time units in general, where n is the number of processors (also, n is the length of the longest match possible). Thus, the number of comparisons in the sequential case is $O(n^2)$.

The above set of comparisons can be rewritten in the following fashion:

| $x_1$-$y_1$ | $x_2$-$y_1$ | $x_3$-$y_1$ | $x_4$-$y_1$ |
|---|---|---|---|
| $x_2$-$y_2$ | $x_3$-$y_2$ | $x_4$-$y_2$ | $y_1$-$y_2$ |
| $x_3$-$y_3$ | $x_4$-$y_3$ | $y_1$-$y_3$ | $y_2$-$y_3$ |

According to the preferred embodiment of the invention, a set of parallel processors are provided, each of which performs a respective vertical set of comparisons. Each processor requires 3 time units ($n-1$ time units in general) to complete a set of comparisons. By performing the n comparisons in parallel, a reduction of comparison time from $O(n^2)$ to $O(n)$ is achieved.

Figure 4:
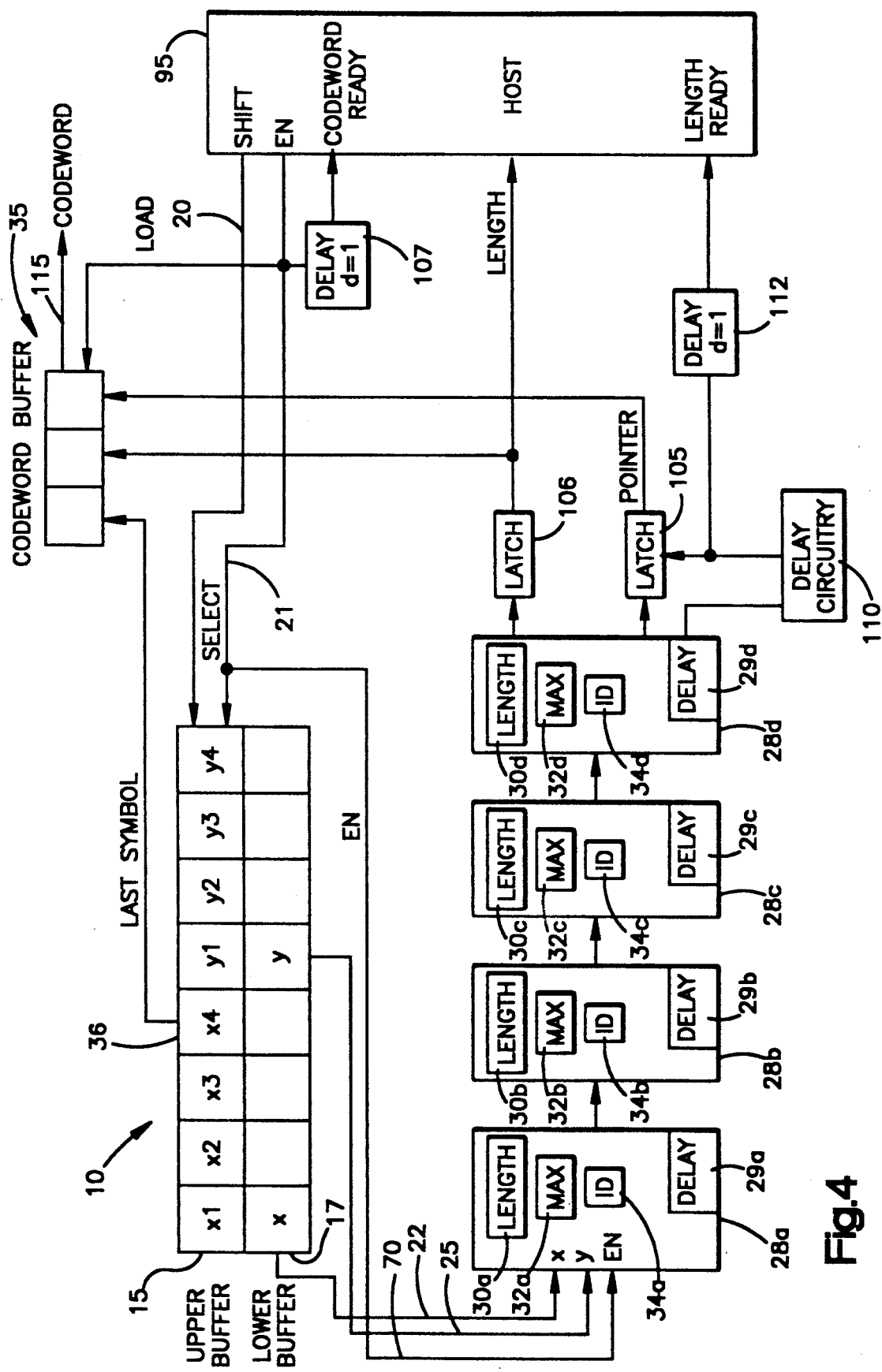
FIG. 4 is a schematic illustration of the compression hardware constructed according to the principles of the present invention.

For example, as shown in FIG. 4, a set of 4 processors 28a-28d can be arranged in a systolic array. The term "systolic" is used to indicate that the processors are connected in a pipeline fashion, with each processor connected only to an immediately adjacent processor. A systolic system could be an array, a tree or a mesh. By replacing a single processor with a systolic array of processors, a higher computation throughput can be realized without increasing memory bandwidth. Moreover, there is a reduction in the number of times a data item is accessed from memory.

The "x" and "y" data symbols are brought into processor 28a from busses 22 and 25, and are routed systolically through each processor from left to right. Each processor 28a-28d includes a delay block, indicated at 29a-29d respectively. The 'delay' block in each processor provides a delay of one time unit for the 'y' values received on bus 25. A space-time diagram illustrating the sequence of comparisons as performed by each processor in the systolic array is given in FIG. 5. The first 3 comparisons shown in each column in FIG. 5 denote the required comparisons to be performed. A symbol 'z' denotes a dummy symbol and the comparisons involving 'z' are unused. For the sake of convenience, 'z' could be set to '0'.

The sequence of comparisons as to be performed by the processors are as follows. The data is first provided on buses 22, 25 to processor 28a and passed systolically to processor 28b. The data then passes from processor 28b to processor 28c, and so on. In the first time unit, $x_1$ and $y_1$ are compared at processor 28a. In the second time unit, $x_2$ and $y_2$ are compared. $x_1$ flows to processor 28b, but is not used, and $y_1$ is delayed through the delay block.

In the third time unit, $x_3$ and $y_3$ are compared at processor 28a. At this time, $y_1$ gets to processor 28b along with $x_2$ and the first comparison is performed at processor 28b. After the third time unit, processor 28a completes all its required comparisons and stores an integer specifying the number of successful comparisons in a "length" register (e.g., 30a in processor 28a). The length registers in the other processors are labeled 30b–30d, respectively. A "max" register (e.g., 32a) holds the maximum length obtained from the previous processors (which for processor 28a is 0). The max registers in other processors are labeled 32b–32d, respectively.

In the fourth time unit, processor 28a compares the value from "max" register 32a with the "length"register 30a and the greater of the two is sent to the "max" register 32b of the next processor. During this fourth time unit, $x_4$ and z are brought in. Although $x_4$ is not used by processor 28a, it is used by the following processors. Similarly, $y_1$ and $y_2$ are input to processor 28a in the following time unit as shown in the space time diagram in FIG. 5. The comparisons involving 'z', are ignored. Even if a 'z' comparison is successful, it does not matter, since the length-max comparison is appropriately placed e.g., in the fourth time unit for processor 28a. Additionally, for proper synchronization, the result of the length-max comparison is sent to the next stage after a delay of one time unit.

The comparisons continue until the value emerging out from the "max" register 32d in the last processor (processor 28d in this case) is the maximum length of the successful comparisons and hence is the length of the longest matching substring. An "id" register 34a–34d respectively, is associated with each processor. The contents of each "id" register indicates the id of the processor where the "max" value occurred and is passed along with the "max" register value to the next processor. The "max" value with the corresponding "id"are output to a codeword buffer, indicated generally at 35, along with the lastsymbol obtained from a shift register 36 in the upper level 15 of the buffer 10. The method takes 12 time units (or 3n units in general) to find the maximum length, where n is the number of processors.

The Processor

As indicated above, each processor 28a–28d performs the following set of functions: (i) the incoming data symbols are compared to check whether they are equal. If the data symbols are equal, a counter is incremented each time until an unsuccessful comparison occurs. The output of the counter gives the length of the match. (ii) Once a processor has found its match, it compares the length with 'max' that arrived from the previous processor. The value of 'max' is the length $\underline{L}$ of the longest substring matched by the previous processors. The greater of the two is routed to the output as 'max' to the next processor. (iii) The identification number or 'id' of the processor that detected the 'max' value corresponding to the largest number of comparisons i.e., the processor that found the longest substring, is also output to serve as the 'pointer' $\underline{P}$. Therefore, the 'id' of the processor corresponding to 'max' is also transmitted along with the 'max'.

Figure 6:
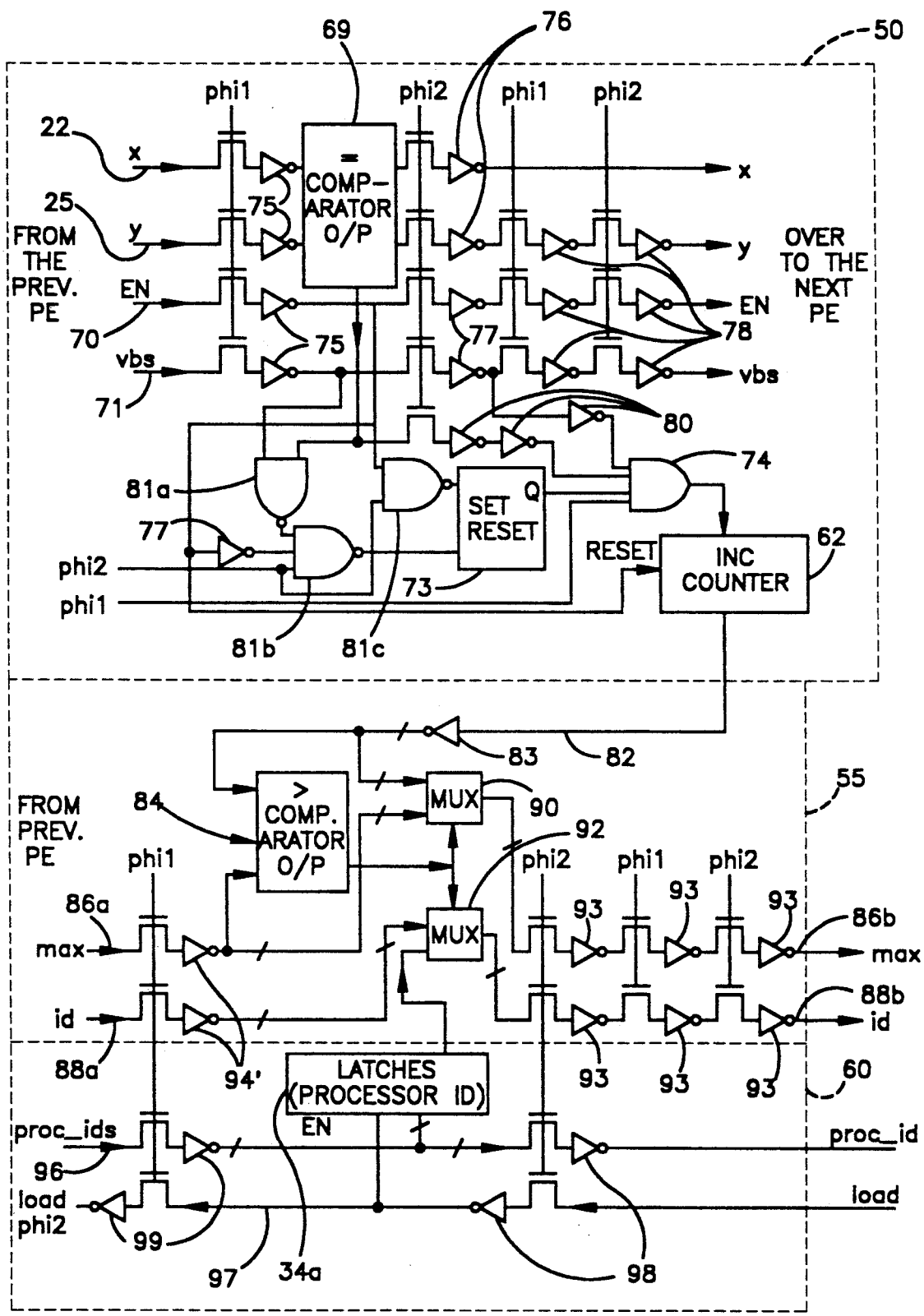
FIG. 6 is a schematic illustration of a processor for the compression hardware of FIG. 4.

The hardware design of each processor is illustrated in FIG. 6. The design consists of three parts: (i) The upper module, indicated generally at 50, (ii) the central module, indicated generally at 55, and (iii) the lower module, indicated generally at 60. The function of the upper module 50 is to find the length of the matching substring from the comparisons associated with it, and store the length in a 7-bit counter 62. The central module 55 checks whether the length generated by the processor (output of counter 62) is greater than the length i.e., 'max', that arrived from the previous processor. The greater of the two is sent to the next processor along with the corresponding 'processor id' (processor identification). The lower module 60 holds the unique processor id.

The hardware organization of the various modules is as follows.

The Upper Module

The upper module 50 is primarily designed to find the longest matching sequence by performing equality comparisons on the symbols. For example, if a string '$x_1x_2x_3x_4$' is to be compared with a string '$y_1y_2y_3y_4$' in order to determine the longest match commencing at $x_1$ and $y_1$ respectively, the symbols $x_1$ and $y_1$ are first compared. In particular, the x symbol in shift register 23 (FIG. 2) and the y symbol in shift register 24 (FIG. 2) in the lower level 17 of the buffer are applied along buses 22 and 25 to comparator 69. If the symbols match in the comparator, the counter 62 is incremented. The length of the matching string is 1. If the symbols are not equal, the counter 62 is disabled and all succeeding successful comparisons are ignored, indicating that those symbols cannot be a part of the match.

During the next time unit, the shift line 20 (FIG. 4) goes high and the symbols in the lower buffer 17 are shifted left one location. The symbols $x_2$ and $y_2$ appear on buses 22, 25 respectively, and are applied to comparator 69. If these symbols are equal and the counter 62 was not disabled in the previous step, the counter is incremented. If they are not equal, the counter 62 is disabled if it was not already disabled. During the next clock cycle, $x_3$ and $y_3$ are compared. If these symbols are equal and the counter was not disabled in the previous step, the counter is again incremented. If $x_3$ and $y_3$ are equal, the counter 62 is disabled as in the previous step. By the end of the fourth time unit, the length of the match between $x_1x_2x_3x_4$ and $y_1y_2y_3y_4$ is known.

The symbols are input during every clock cycle into each processor. The clock cycle is a two-phase non-overlapping clocking scheme. One phase of each clock cycle is provided on the "phi1" lines, while the other phase is provided on the "phi2" lines. When a single bit control signal EN (enable) is received on line 70, the processor begins the matching operation from the next clock cycle onwards. A 'valid bit signal', or vbs, on line 71 provides proper termination of the matching operation when the end of the data string is reached. However, it should be noted that the vbs signal is 'high' whenever the 'y' symbol is a valid signal. An invalid signal would be a dummy symbol that can be appended beyond the end of file symbol to fill up the buffer. Appropriate circuitry is required to disable the counter 62 when the vbs signal is 'low'.

An R-S flip-flop, indicated generally at 73, enables and disables the counter 62 and hence controls the matching operation of the processor. There are 4 sets of signals that are input to the upper module 50: the x and y symbol buses, 22, 25 respectively, the EN signal line 70, and the vbs line 71. An O/P signal is derived from the x and y symbols in comparator 69. If x and y are equal, O/P=1; if they not equal, O/P=0. The EN signal 'resets' the counter 62 and 'sets' the output of the flip-flop 73 to 1, thus enabling the counter 62. The counter 62 is incremented during phi1 only when vbs is high, EN is low and O/P is high. However, when O/P or vbs goes low, the flip-flop 73 is reset, disabling the counter 62 from next cycle onwards. The truth table for this 'active low' flip-flop is given in FIG. 7.

To set the output of the flip-flop 73 to 1, S is set to O and R is set to 1. As discussed above, the inputs S and R are derived from O/P, EN and vbs. EN sets the flip-flop. Therefore, S=0 iff EN=1. The flip-flop is reset under conditions mentioned in the previous paragraph. R=0 iff ((O/P = 0 OR vbs = 0 ) AND EN=0). The inputs to the flip-flop are clocked using qualified phi2 signals. The boolean equations for deriving the S (set) and R (reset) signals are as follows:

$$\text{Set} = \overline{EN \cdot phi2}$$

$$\text{Reset} = \overline{(\overline{vbs} + \overline{O/P}) \cdot \overline{EN} \cdot phi2}$$
$$= \overline{\overline{vbs \cdot O/P} \cdot \overline{EN} \cdot phi2}$$

The input to the counter 62, which is the "Inc" signal received from AND gate 74, is given by Inc = vbs.O/P.Q. phi1, where Q is the output of the flip-flop 73. This implies that the counter 62 is incremented if and only if all the 4 signals are high. The counter 62 and associated circuitry in each processor comprise the 'length registers' 30a-30d, respectively.

The latches 75 on the x, y, EN and vbs lines before the comparator 69 are controlled by the phi1 signal. The latches 76 on the data lines that follow the comparator 69 are controlled by the phi2 signal and provide the stable phi1 signal to the next processor. Similarly, latches 77 on the EN and vbs lines are also controlled by the phi2 signal and provide a stable signal to the next processor. Other latches, indicated at 78, on the y, EN and VBS lines, provide a one cycle delay required for synchronization i.e., comprise the 'delay block' in each processor 28a-28d respectively. Further, latches 79, which are controlled by phi2 signal, are located between the O/P, vbs lines to provide a stable phi1 signal to AND gate 74.

The latches described above, or any of the latches described with respect to the present invention, preferably comprise a single transmission gate and inverter (i.e., a dynamic latch). However, it is also within the scope of the present invention to provide latches which or can comprise multiple transmission gates and inverters (i.e., a recirculating latch) if it is necessary to store charge in the latch for long periods of time (e.g., more than 2 clock cycles).

Finally, NAND gates 81a, 81b and 81c provide appropriate logic for the flip-flop 73 from the EN, O/P and vbs lines. NAND gate 81a provides a stable phi2 output signal from O/P NAND vbs, which, along with the EN signal (through latch 78), is NANDed with phi2 to provide a qualified phi2 signal to one input of flip flop 73, EN is also NANDed with phi2 through gate 81c to provide a qualified phi2 output signal to the other input of flip flop 73. The output of the flip flop 73 (i.e., "Q") is therefore a stable phi1 signal. The inputs to NAND gate 74, i.e., EN, vbs and Q, are ANDed with phi1 to provide a qualified phi1 signal to counter 62.

The Central Module

Figures 5, 7, 8:
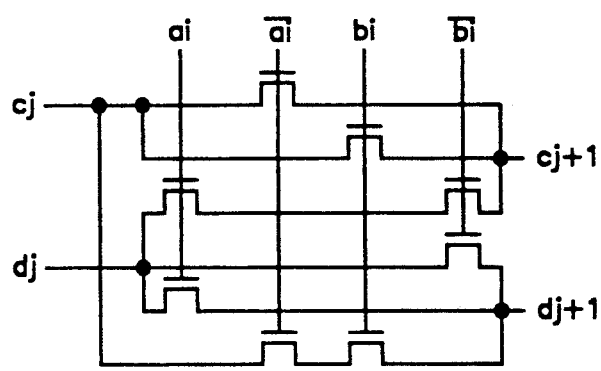
FIG. 5 is a space-time diagram illustrating the sequence of comparisons performed in the systolic array of parallel processors.
FIG. 7 is a schematic illustration of a truth-table for the R-S flip-flop.
FIG. 8 is a schematic illustration of a cell for a lexical comparator.

The central module 55 determines if the length generated by the particular processor is greater than the length obtained from the previous processor. The length of the match in the processor (which is the output bus 82 of the counter 62) is applied through latch 83 and is compared with the maximum length from the previous processors. The 7-bit lexical comparator, indicated generally at 84, is preferably used for this purpose. The basic logic cell for the lexical comparator 84 is indicated in FIG. 8. The comparator provides an output of 1 if A>B, and an output of 0 if A< =B. A 7-bit bus, indicated at 86a, carries the length of the longest match found from the previous processor(s) to the comparator 84 and is controlled by the phi1 signal.

The central module 55 further includes multiplexers 90 and 92. The output of the comparator 84 (i.e., O/P) is used to connect appropriate input lines of the multiplexers 90, 92 to the output of the 'max', line 86b and the 'id' line 88b. The id line 88a of the processor corresponds to the 'max', e.i., the id of the processor that succeeded in finding the longest match, and is controlled by the phi1 signal. The lexical comparator 84 produces an output of 1 (i.e., 'high') if the output 82 of the counter 62 is greater than 'max' on line 86a. This 'high' output indicates that a longer match has been found in the processor. In this case, multiplexer 90 selects the output 82 of the counter 62 as the length of the longest match to be sent to the output 86b of the processor as 'max' for the next processor.

The other multiplex 92 selects the current 'processor id' from the lower module as the id corresponding to that 'max' and sends the id to output 88b. In the event when 'max' is greater than the output 82 of the counter 62, then 'max' and the 'id'corresponding to the prior processor are sent to the outputs 86b, 88b respectively. Latches 93 provide a delay for the max and id lines 86 and 88b; while latches 94 are controlled by the phi1 signal and provide inputs to the comparator and the multiplexers.

The Lower Module

The lower module 60 holds the processor id corresponding to the respective processor, i.e., the lower module comprises an 'id' register 34a-34d, respectively. To this end, each processor is assigned an id (identification number) to uniquely identify the processor from others. Since this id serves as the pointer, the processors from left to right are preferably assigned id values 0, 1, 2 and so on, in that order. The id value can be hard-wired within the processors, i.e., a different 'id' can be hardwired in each processor. However, in order to maintain all processors identical, it is preferred to load the ids from an external source (i.e., from host 95) along bus 96 into each 'id' register 34a-34d, respectively.

In particular, the 'id' values are loaded in a systolic fashion in 2n−1 cycles (where n is the number of processors) by providing a load signal on bus 97 from the host. The load signals are passed from right to left along the array of processors. Each id value is input every other clock cycle from the host. As each processor receives an id value corresponding to its location (i.e, an id of "2" for the second processor), the load signal for the particular processor goes high and latches the id into the register. Latches 98 on lines 96 and 97 are controlled by the phi2 signal, while latches 99 are controlled by the phi1 signal. The load signal thereby flows in a systolic fashion, which decreases the propagation delay and hence increases the overall clock speed. It should be noted that the ids have to be loaded into the id register only once, that is, when the chip is powered up. Once the ids are loaded, they remain in the 'id' registers until the chip is turned off.

The Compression Chip Architecture and Interface

The LZ compression technique involves transformation of variable length strings of data symbols into fixed length codewords. The codewords should be as short as possible to achieve maximum compression. The strings are preferably generated using the ASCII code, since the code is 7 bits long and can uniquely represent 128 different symbols. Accordingly, in using the ASCII code, the choice of buffer size for the symbols is crucial since it affects the compression ratio.

As described above, each codeword that is formed by the processors contains three parts — the pointer $\underline{P}$, the length $\underline{L}$ and the lastsymbol of the substring. A byte is assigned for each of these three parts. Accordingly, the length of the codeword is preferably 3 bytes. The highest bit in each byte is reserved for a reason discussed later. Therefore, 7 bits in each byte are available to represent the three parts. The length $\underline{L}$ and pointer $\underline{P}$ both can take values from 0 to 127. The lastsymbol, also being an ASCII symbol, can also take values between 0 and 127.

For a buffer of size $\underline{n}$ bytes which is divided into two equal lengths (one part for symbols already coded while the other for symbols yet to be coded), the maximum number of pointer/length values possible are $\underline{n}2$ (i.e. from 0 to $\underline{n}/2-1$). Therefore, for 128 distinct pointer/length values, a buffer of 256 bytes would be required. It should be noted that greater compression can be achieved if the ratio (Length of the codeword (L)/maximum length of the match (M)) is smaller. Note also that the maximum length of the match equals n/2, where n is the length of the buffer.

For efficient compression, all the bits in the codeword must be used. This implies that the length and the pointer values should extend up to the maximum value allocated to them. For example, in a codeword that is 3 bytes long, the pointer is allocated a byte from which 7 bits are available for use, as discussed earlier. The pointer can take values from 0 through 127. A buffer of size 256 would be required to produce pointer values from 0 through 127.

Other size codewords can be used e.g., 2 bytes, 5 bytes, etc. A codeword of size 2 however, lowers the compression ratio; while a codeword of size 5, although achieving a slightly better compression ratio than the codeword of size 3, requires a much larger buffer. Moreover, it has been determined that the increase in compression efficiency is very marginal for a codeword of size 5 as compared to a codeword of size 3.

As shown in FIG. 10, tests were performed to observe the effect of the buffer size on the compression ratio. The buffer that yielded the maximum compression ratio had a size of 256 locations (i.e. n=256), with pointer/length = 128 values. The codeword used for this buffer size had a size of 3 ASCII symbols per codeword, the components of which have been described previously. The buffer of size 256 was used in calculating the compression ratios for a large set of files for performance comparisons. Accordingly, it has been determined that a buffer of size 256 is preferred for VLSI realization while maintaining good compression efficiency. The corresponding size for each codeword is therefore 3.

Software routines incorporating the LZ based data compression technique have been tested. As illustrated in FIG. 11, the compression achieved on text files by the LZ technique was greater than that achieved by other methods like adaptive Huffman. However, the performance of the LZ technique was considerably improved by modifying the coding part — which will be described in the following paragraphs.

In particular, direct application of the LZ technique did not perform efficiently in all cases. It may be noted that since the codeword is of length 3, if there is no match or if there is only one match, either one or two symbols that respectively constitute the substrings would be replaced by codewords of length 3. This would be "expansion" rather than "compression". If many such mismatches occurred in a file, i.e., the file did not have many repetitive patterns, the compression achieved would be minimal.

Accordingly, to eliminate the 'expansion' problem, a codeword of length less than 3 is used in the case of a mismatch. To this end, the unused bit in the 7 bit ASCII symbol is used as a 'tag' bit to achieve a decrease in the codeword size. If no match is found, the substring will be just one symbol, represented by the lastsymbol. In this case, the symbol itself is taken to be the codeword and the tag bit is set to 1 to indicate a codeword of one byte in length. If a match of one symbol is found the substring will be two symbols long, represented by the matched symbol and the lastsymbol. Accordingly, the codeword is then two bytes in length. The tag bit in each of the two bytes of the codeword is set to 1. In the regular encoding where the substring is 3 long, each of the tag bits in the three bytes of the codeword is set to 0. The decompression technique, as discussed herein in more detail, checks the tag bit in each byte to decode the codeword.

This method of using a 'tag' bit has been incorporated into software and it has been determined that the compression ratio has been improved. The performance comparison of this modified LZ technique with the original LZ technique is also shown in FIG. 11.

Figure 12:
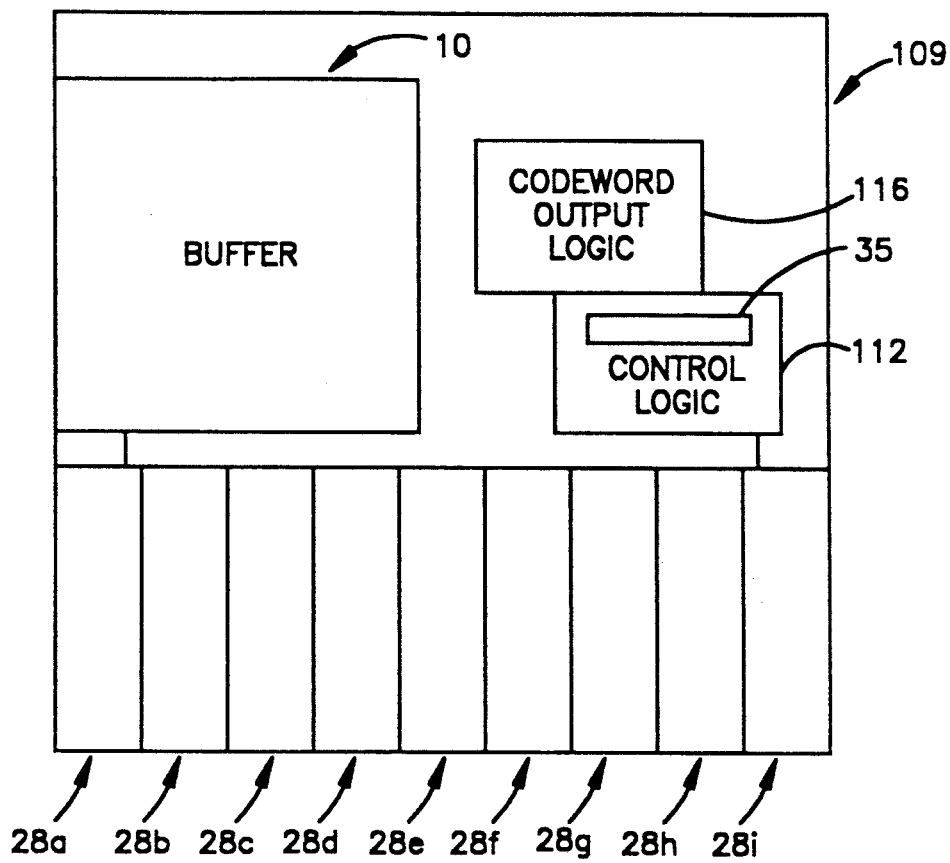
FIG. 12 is a schematic circuit layout of the compression hardware constructed according to the principles of the present invention.

According to the present invention, it is preferred that the entire compression architecture be implemented on a single chip, for example as illustrated at 109 in FIG. 12. The number of processors can be increased to provide enhanced performance, for example, a systolic array of nine processors as shown at 28a-28i, can be used. Moreover, it has been determined that a systolic array of 128 processors with a window of size 256 yields very good compression for ASCII text data. The architecture to implement the LZ-based data compression technique can be implemented in VLSI/WSI hardware. The host could be a CPU or a microprocessor chip.

Figure 13:
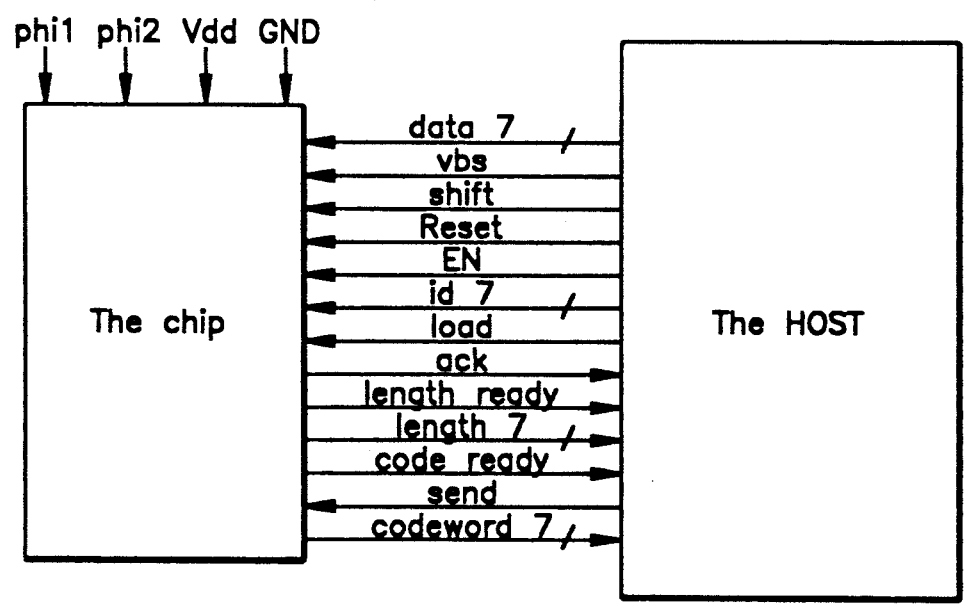
FIG. 13 is a schematic representation of the interface between the compression hardware and the host.

The various signals used for handshaking between the compression chip and the host are shown in FIG. 13. The sequence of communication events between the chip and the host is described in the following steps. To simplify discussions, a 4-processor systolic array is assumed.

(1) Loading of the ids: The host sends these ids over the 'id' bus 96 and issues the 'load' signal on bus 97.
(2) After the ids are all loaded, the chip sends an acknowledge signal 'ack' indicating to the host that all ids have been loaded.
(3) After the host receives the 'ack' signal, it sends a 'Reset' signal that resets all buffers in the chip.
(4) The host then sends the first 4 symbols on the data bus 8 with the 'shift' signal on bus 20 enabled. The symbols are shifted into the buffer, one at a time.

Also, the host enables the 'vbs'bus 71 to indicate the presence of valid data on the data bus.

(5) The host issues the EN signal on bus 21 in the next clock cycle. When the EN signal is enabled, the following functions are performed: (i) The contents of the upper buffer 15 are transferred to the lower buffer 17. (ii) The EN signal is passed on to the processors on bus 70 for synchronization of their processing. (iii) The output codeword is latched through latches 105, 106 (FIG. 4), and from shift register 36 in the upper level of the buffer to the codeword buffer 35. The 'codeword ready' signal is generated from the EN signal on bus 21 by providing a 1 clock cycle delay through delay circuit 107.

(6) After the EN signal is enabled, control is transferred to the systolic array of processors. The processors perform the sequence of comparisons. The EN signal which emerges out of the final processor goes through a delay of four cycles in delay circuitry 110 and then through latches 105, 106 to latch the pointer P and the length L to the codeword buffer 35. Delay circuitry 110 can comprise e.g., flip flops, counters and delay blocks which are controlled by both phi1 and phi2.

(7) The 'length ready' signal that is generated through delay circuit 112 from delay circuitry 110 indicates to the host that the length is available on the 'length' bus. The host uses this information to shift 'length+1' new symbols into the upper buffer of the chip. The latches 105, 106, and delay circuitry 107, 110, 112, together comprise the control logic for proper synchronization and are illustrated at 112 in FIG. 12.

(8) After shifting 'length+1' symbols into the buffer, the host issues the EN signal again that performs functions as in (5).

(9) When the codeword buffer has been loaded, the 'codeword ready' signal is generated from the EN signal.

(10) After receiving this 'codeword ready' signal, the host issues a 'send' signal requesting that the codeword be sent over the "codeword" bus 115. The "send" signal triggers the control unit that shifts out the codeword one byte at a time during the next 3 clock cycles into other appropriate memory, e.g., ROM (not shown). The logic to shift out the codeword in codeword buffer 35 is illustrated at 116 in FIG. 12.

A prototype VLSI chip was designed using CMOS p-well 2-micron technology and was fabricated by a MOSIS facility. A systolic array of 9 processors was implemented. The chip was designed using a 2-phase non-overlapping clocking scheme. The chip required 41 pins and hence was fabricated as a 64-pin package. Each processor required 3457×343 lambda and the whole chip was fitted on a 6.68×4.48 mm MOSIS standard frame. Each processor required 1366 transistors and the whole chip required 18397 transistors. Based on the estimates from the prototype implementation, a real life compression chip can compress at the rate of 20 million characters per second operating at 40 Mhz, assuming a 50% average compression efficiency.

The Decompression Architecture

Two architectures are provided for the decompression of files compressed using the LZ technique. The first architecture is a sequential architecture which uses global broadcast of the data signals. The second architecture is a semi-systolic architecture in which global signals are used only for the control logic. Both architectures provide decompression at the rate of one symbol per clock cycle. The hardware for decompression can also be incorporated into a single chip using VLSI/WSI technology.

The Decompression Algorithm

Figure 14:
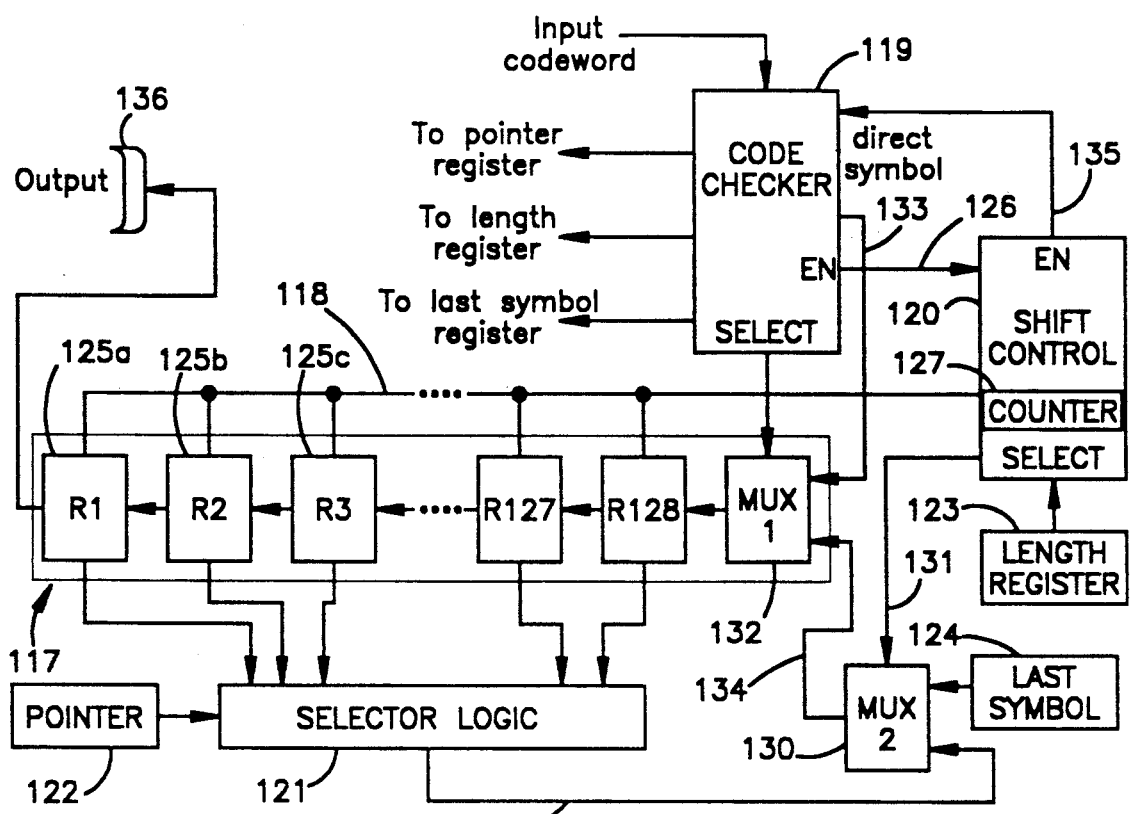
FIG. 14 is a schematic representation of a circuit diagram for the sequential decompression architecture.

Referring now to FIG. 14, if a buffer of size B was initially used for the compression process described above, then a buffer of size B/2, as indicated at 117, is required for the decompression phase. The length of each codeword is 3 bytes. The pointer and the length are each one byte long and take values from 0 through 127. The pointer length and the lastsymbol directly map onto the three bytes. This eliminates the need for additional hardware for decoding the codeword into the three parts.

The registers in buffer 117 are initially loaded with zeros to conform with the initialization of the compression buffer. The buffer 117 at any time contains decompressed characters. The first B/2 characters that are shifted out are ignored since they represent the characters that were used for initialization. Similarly, when all the codewords have been decompressed, the B/2 decompressed characters that are still in the buffer are then shifted out. The sequence of steps for decompression can be stated as follows:

1. Reset all flip-flops.
   Loop
2. Get codeword.
3. Decode codeword.
   First symbol is the pointer.
   Second symbol is the length
   Third symbol is the 'lastsymbol'.
4. Use pointer to select the corresponding location of the buffer.
5. For 1 to length:
   Shift every symbol in the buffer one position to the left. The contents of the selected location of the buffer are shifted into the rightmost location of the buffer. The output of the leftmost location of the buffer corresponds to the decompressed data.
6. Shift once more, shifting the 'lastsymbol' into the buffer.
   Until the end of codewords.
7. Shift out all the symbols currently in the buffer.

The Sequential Architecture

The sequential architecture for decompression is shown in FIG. 14. The architecture includes a buffer having 128 locations. The locations are shift registers whose contents are shifted left each time the 'shift'line 118 goes high. The architecture also includes a Code Checker 119, a Shift Control 120 and Selector logic 121.

The Code Checker 119 can be incorporated into software or preferably incorporated in the host. The code checker 119 operates as follows. As described previously, the expansion problem during compression was eliminated by allowing a codeword to have a length smaller than 3. The eighth bit (MSB) in a code symbol is the tag bit that determines the size of the codeword. A tag bit of 0 indicates that the code symbol is a part of a codeword of length 3 and a tag bit of 1 indicates that the code symbol is a part of a codeword of length 1 or 2. A codeword of length 1 or 2 is just the original symbol with a 1 added to its MSB. The Code Checker 119 initially receives the codeword from memory and checks the tag bit in the codeword. If the bit is a 1, the Code Checker 119 removes the 1 and the symbol is sent to the buffer 117 directly. If the tag bit is a 0, then the lower 7 bits of three code symbols are sent to three registers: i) the pointer register 122, ii) the length register 123 and iii) the lastsymbol register 124. The symbols having a 0 in their tag bit will always occur in multiples of 3, since 3 adjacent symbols form a codeword.

When the three symbols i.e., the pointer P, length L and lastsymbol are shifted into the appropriate registers, the Code Checker 119 generates an EN (enable) signal on bus 126. The EN signal is applied to the Shift Control 120 and the length L is loaded from the length register 123 into a down counter 127. The Shift Control 120 generates 'length+1' number of pulses. These clock pulses are used to shift the contents of the buffer 117 (128 shift registers) one position to the left each time. The pointer register 122 serves as the control input to the Selector Logic 121 through bus 128 and selects the location of the buffer corresponding to its value. The Selector Logic 121 shifts the value from the location selected to the last location in the buffer 117.

The Selector Logic 121 could be either a 128:1 multiplexer or some decoding logic made up of AND gates and transmission gates. The multiplexer MUX2, indicated at 130, is controlled by Shift Control 120 through bus 131. The multiplexer 130 is a 2:1 multiplexer, which selects the output of Selector Logic 121 for length L shifts and the lastsymbol register 124 for the next shift. MUX1, as indicated at 132, is controlled by the Code Checker 119. The upper line 133 is selected if the Code Checker sends a symbol directly to the buffer 117. Otherwise, the lower line 134 is selected to provide the pointer P, length and lastsymbol to the buffer.

After 'length+1' shifts, the 'Shift Control' 115 returns the EN signal to the Code Checker 119 over bus 135. The Code Checker 119 then starts working on the next codeword. At the output, another control logic block 136 ignores the first 128 symbols that are shifted out. Also, after all the codewords are decoded, the logic block shifts out the last 128 symbols from the buffer 117. This is done in collaboration with the Shift Control 120.

The Semi-Systolic Technique

Figure 15:
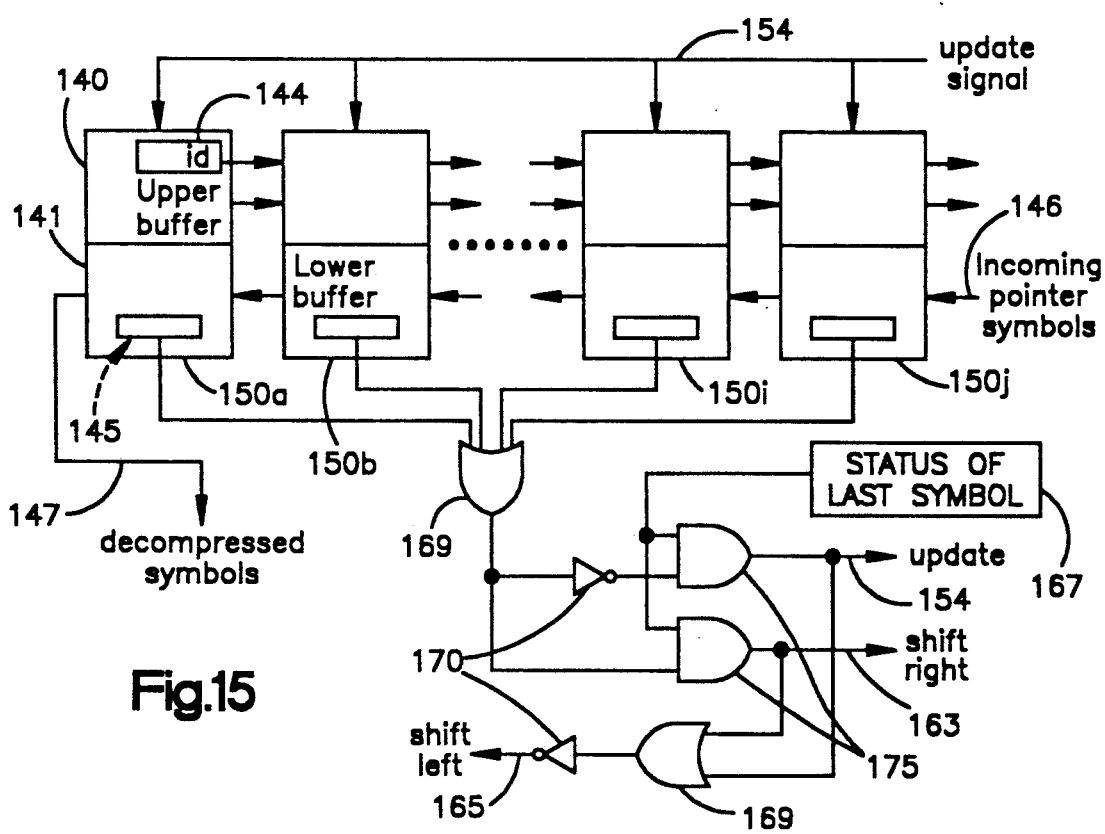
FIG. 15 is a schematic representation of a circuit diagram for the semi-systolic decompression hardware.

Referring now to FIGS. 15 and 16, the semi-systolic technique for decompression is described. The term 'semi-systolic' is used to describe this architecture instead of just 'systolic', because of the presence of some global signals in the architecture. For example, assume a buffer of size 9. In the real decompression architecture, a buffer of size 128 is required assuming n=256. Let the current contents of the buffer be 000000102 (see e.g., FIG. 17). The next codeword to be decompressed has the following information: pointer P=6, length L=4, and the lastsymbol=1. This codeword produces a decompressed string 10211.

To understand the semi-systolic technique, consider a two-level buffer having an upper and lower level 140, 141 respectively, as shown in the FIG. 15. Each buffer location has an identification number or 'id' register 144. The upper level 140 of the buffer contains the symbols decoded up to the last codeword. The lower level 141 contains a mixture of decompressed symbols and pointer symbols. "Pointer symbols" are symbols derived from the pointer. Their derivation is explained in the following paragraphs. The tag bit 145 in each location of the lower level distinguishes the two types of symbols. The contents of the lower level 141 are copied to the upper level 141 whenever a codeword is totally decompressed. Data is moved into the lower level 141 from the right on data bus 146 and the decompressed symbols are taken out from the left on data bus 147.

FIG. 17 illustrates symbols that were decompressed from the previous codeword in the lower level 141. The upper level 140 of the buffer is updated from the lower level, since the previous codeword was completely decompressed. The new codeword has pointer P=6, length L=4 and lastsymbol=1. This information is preprocessed so that the codeword is expanded to 67891. The first four bold digits in this expanded codeword indicate pointer symbols. The pointer symbols are a sequence of increasing values whose first value is the pointer value. The number of pointer symbols is equal to the length. The '1' in the string is the lastsymbol.

The pointer symbols are replaced by their actual values at the corresponding location in the buffer. For example, the pointer symbol 6 would be replaced by the symbol from the upper buffer at the buffer location with id=6. Note that there is no buffer location with id 9. However, the pointer symbol string follows a 'rule of wrap-around'. Therefore the digit 9 in the pointer symbol string 67891 is replaced by 6 which is the first of the pointer symbols to become 67861. As another example, a string 6 7 8 9 10 11 12 2 is modified to 6 7 8 6 7 8 6 2.

FIG. 18 shows the state of the buffers after one pointer symbol of the codeword is moved in. The pointer symbol and the id of the buffer are compared. If they are equal, the symbol in the upper buffer 140 is copied to the lower buffer 141. In FIG. 18, there is no match and therefore no replacement of the pointer symbol is done.

After another 2 shifts, the buffer appears as shown in FIG. 19. The pointer symbols 6, 7 and 8 correspond to the id's of the buffer locations they are currently in. Therefore, the symbols in the upper level are copied to the lower level for those locations so that the state of the buffer becomes as shown in FIG. 20.

FIG. 21 shows the buffer after two more shift operations. It may be noted that the lastsymbol is moved into the buffer. This implies that all the components of the expanded codeword are inside the buffer. No more shifts can be applied, i.e., the pointer symbols of the next codeword cannot be brought in until the upper level is updated. The upper level can be updated only when all the pointer symbols in the lower level are replaced. The constraints therefore are that pointer symbols of a new codeword cannot be moved in and the upper level cannot be updated until all the pointer symbols currently are replaced by decompressed symbols.

It is preferred to decompress all the remaining pointer symbols by moving the contents of the upper level along with the ids to the right. After one such shift, the buffer is as shown in FIG. 22. Here, the id and the pointer symbol match, and the pointer symbol in the lower level is replaced by the symbol in the upper level, i.e., 1 in this case. Since the previous codeword is completely decompressed, the upper buffer is updated. The buffer appears as shown in FIG. 23. The process of decompression continues until all codewords are decoded.

The Semi-systolic Architecture

The semi-systolic architecture for decompression is shown in FIG. 15 illustrating nine (9) processors, illustrated at 150a-150j; however, additional processors can be added, depending upon the number of processors used during the compression process. The main components of the processor are the upper register and the lower registers 148, 149 respectively (FIG. 16), that form a part of the upper level 140 and lower level 145 of the buffer, respectively. The 'Processor Id'register 151 holds the id of the processor. This id could either be hardwired or downloaded from an external source. The contents of the "Processor id" register 151 are copied to the 'id' register 144 each time the signal on the update line 154 goes high. The 'tag' bit 145 in the lower register 149 is used to distinguish between pointer symbols and the decompressed symbols. If the lower register 149 contains a pointer symbol, the tag bit is set to 1. Otherwise, the bit is set to 0.

The contents of the upper register 148 are copied to the lower register 149 when the lower register contains a pointer symbol (identified by the tag bit) and the value of this pointer symbol is equal to the id value. The 'equal comparator' 160 performs the comparison. The tag bit value of 1 enables this copying through gate 161. Once the symbol is copied to the lower level, the tag bit is changed to '0' to indicate that it is now a decompressed symbol. When an 'update'signal is issued on line 154, the contents of the lower level 141 are copied to the upper level 140 and the 'Processor id' in register 151 is copied to the id register 144. The update signal is a global signal and its generation is explained in the following paragraphs. The delays over this signal line can be reduced by using pre-charged logic.

The contents of the upper level 140 are shifted right into an adjacent processor on every clock cycle when the shift right signal 163 is enabled. The contents of the lower level 141 are shifted left on every clock cycle into an adjacent processor when the shift left signal 165 is high. The symbols shifted left from processor 150a are the decompressed symbols. The symbols shifted into processor 150j from the right are the pointer symbols or the lastsymbols. The contents of the lower level 141 are copied to the upper level 140 when the 'update signal' 154 goes high. The processors are thereby responsive to the control signals. A status bit 167 stores information about the status of the lastsymbol. If the lastsymbol is in the rightmost processor, i.e., processor 150j in this case, this status bit is set to 1. Otherwise, the bit is set to 0.

The contents of the lower buffer 145 are shifted left until the lastsymbol enters processor 150a. If all the pointer symbols have been replaced by decompressed symbols, all the tag bits are set to 0. This, along with the signal from the status bit 167 would set the 'update' control signal 154. If, however, all the signals are not replaced, then the shift right signal 163 is enabled to shift the contents of the upper buffer 140 right until all the pointer symbols are replaced. Except for the update signal 154, all the other data signals are moved through the processors in a systolic fashion. To provide the above logic, OR gates 169, latches 170 and AND gates 175 are included.

Since pre-charge logic can be used for this update signal line, the delays involved due to this line can be decreased, hence increasing clock speed. Some cycles are lost while shifting right, i.e., no decompressed symbols are shifted out during this period. However, shifting right does not occur often during decompression in a normal situation. Additionally, a decompression rate of approximately one symbol per clock cycle is provided. The semi-systolic architecture provides increased clock speed as compared to the sequential architecture by minimizing propagation delays.

Accordingly, the present invention provides VLSI architecture for implementing the Lempel-Ziv based data compression technique to provide an efficient method for reducing the redundancy in data transmission. The Lempel-Ziv based compression technique gives high compression efficiency for text as well as image data. The proposed hardware exploits the principles of pipelining and parallelism in order to obtain high speed and throughput. The time complexity of comparisons is reduced from $O(n^2)$ in the sequential case to $O(n)$ using the proposed technique, where n is the size of the longest match possible. The techniques can be embodied on a CMOS VLSI chip using CMOS 2-micron technology implementing a systolic array of nine processors. The data compression hardware can be integrated into real time systems so that data can be compressed and decompressed on-line.

Additionally, the decompression hardware can be incorporated into a VLSI chip to provide decompression at the rate of one character per clock cycle. The decompression hardware can be either sequential or semi-systolic.

Although the invention has been shown and described with respect to a certain preferred embodiment, it is obvious that equivalent alterations and modifications will occur to others skilled in the art upon their reading and understanding of the specification. The present invention includes all such equivalent alterations and modifications, and is limited only by the scope of the following claims.

What is claimed is:

1. A method for parsing and coding a string of a variable number of uncoded data symbols to provide a fixed length codeword, comprising the steps of:
   providing a symbol storage device having predetermined storage locations, said storage locations arranged into a first half and a second half,
   initializing the storage locations in the first half of said symbol storage device with predetermined data symbols,
   inserting an uncoded string of data symbols into the storage locations in the second half of said symbol storage device,
   comparing the data symbols in the storage locations in the second half of said symbol storage device with the predetermined symbols in the storage locations in the first half of said storage device using a plurality of processors, said processors being connected in a systolic array, and each processor in said systolic array of processors comparing selected pairs of data symbols and selectively passing the data symbols to an adjacent processor,
   providing fixed length outputs from the systolic array of processors indicating: i) the length of the longest string of data symbols in the first half of the storage device that matches a string of data symbols from the second half of said symbol storage, and ii) the storage location in the first half of said symbol storage device of the starting point for said string,
   shifting the data symbols of said longest matched string and the data symbol immediately following said longest string from the storage locations in the second half of said symbol storage device into the storage locations in the first half of said symbol storage device in a predetermined sequence and shifting subsequent uncoded data symbols into the storage locations in the second half of said symbol storage device, providing a fixed length output from said symbol storage device indicating the data symbol that immediately follows said longest string, arranging the fixed length outputs from the systolic array of processors and the fixed length output from said symbol storage device in a codeword storage device to provide a codeword having a fixed length.

2. A system for parsing and coding a string of a variable number of uncoded data symbols into a codeword having a predetermined maximum length, comprising:

a symbol storage device having predetermined storage locations, said storage locations arranged into a first half and a second half, said storage locations in said first half having means to initially receive a string of predetermined data symbols, and said storage locations in said second half having means to receive a string of uncoded data symbols, a plurality of processors connected in a systolic array adapted to selectively receive data symbols from predetermined storage locations in each half of said symbol storage device, each of said processors having means to compare selected pairs of data symbols and means to selectively pass the data symbols to an adjacent processor, said systolic array of processors having means for providing fixed length outputs indicating: i) the length of the longest string of data symbols from the storage locations in the first half of said symbol storage device that matches a string of data symbols in the storage locations from the second half of said symbol storage device and ii) the location in the first half of said symbol storage device of the starting point for said string, said symbol storage device having means for shifting the data symbols of said longest string and the data symbol immediately following said longest string from the storage locations in the second half of said symbol storage device in a predetermined sequence into the storage locations in the first half of said symbol storage device and means for shifting subsequent uncoded data symbols into the storage locations in the second half of said symbol storage device, said symbol storage device having means for providing a fixed length output indicating the data symbol in the storage location in the first half of the symbol storage device immediately following said longest string, and a codeword storage device receiving said fixed length outputs from said systolic array of processors and said fixed length output from said symbol storage device, said codeword storage device providing a codeword having a predetermined maximum length indicating the length of said longest string, the starting point of said longest string and the data symbol immediately following said longest string.

3. A system as in claim 2, wherein said storage locations in said symbol storage device are arranged in a first level and a second level, wherein each of said first and second levels has a first half and a second half, said storage locations in said first half of said first level having means to initially receive said string of predetermined data symbols and means to copy said predetermined data symbols into said storage locations in said first half of said second level, and said storage locations in said second half of said first level having means to receive a string of uncoded data symbols and means to copy said string of uncoded data symbols into said storage locations in said second half of said second level.

4. A system as in claim 3, wherein said symbol storage device includes a select line having selectable high and low states, said predetermined data symbols and said string of uncoded data symbols being copied from said storage locations in said first level into said storage locations in said second level when said select line goes from said low state to said high state.

5. A system as in claim 4, wherein said symbol storage device also includes a shift line having selectable high and low states, the subsequent uncoded data symbols being shifted into said second half of symbol storage device when said shift line goes from said low state to said high state.

6. A system as in claim 5, wherein said storage locations in said first half of said first level of said symbol storage device have a last location, and said symbol storage device has means for providing a fixed length output from said last location indicating the data symbol in the storage location in the first half in the first level of the symbol storage device immediately following said longest string.

7. A system as in claim 6, wherein said symbol storage device comprises a buffer having a predetermined number of storage locations.

8. A system as in claim 7, wherein said buffer has 256 storage locations.

9. A system as in claim 8, wherein said storage locations in said first half of said first level of said buffer have means to initially receive a string of 0's.

10. A system as in claim 2, wherein said systolic array of processors includes means to determine the length of the longest matching string of data symbols and the location in the first half of said symbol storage device of the starting point for said string, and the symbol storage device includes means to determine the data symbol in the storage location in the first half of the symbol storage device immediately following said longest string according to the following technique:

| Variables | |
|---|---|
| i,j: | indices marking locations in the first and second halves of the buffer |
| cur_length: | indicates the number of symbols that are matched so far. |
| max_length: | contains the length of the longest matching substring (that is matched). |
| pointer: | Contains the index of the position in the first half of the buffer where the match commenced. It corresponds to the longest match so far. |
| $x_{index}$: | The $index^{th}$ location in the buffer. |
| $y_j$: | The $j^{th}$ location in the y part of the buffer. |

The Algorithm

Initialization
  Locations $x_1$ through $x_4$ are loaded with zeros.
  Locations $y_1$ through $y_4$ contain the first 4 symbols of the strings to be coded.

Phase 1 maxlength := 0;
pointer := 0;
for i := 1 to 4
    index: = i;
    cur_length:= 0;

```
Phase 1
    for j:= 1 to 3
        if (x_index <=4)
            if (x_index = y_j) then cur_length:=cur_length+1
            else break; {exit the "for" loop}
            endif;
        else
            if (y_index-4 = y_j) then cur_length: = cur_length+1
            else break; {exit the "for" loop}
            endif;
        endif;
    endfor;
    if cur_length > maxlength then
        maxlength:= cur_length;
        pointer:= i;
    endif;
endfor.
```

Phase 2

Pointer and maxlength obtained in Phase 1 are coded along with one symbol following the reproducible extension (i.e., the symbol at location maxlength + 1 in the y part of the buffer) as the lastsymbol of the code. The symbols in the buffer are shifted left "maxlength + 1" times and maxlength + 1 new symbols are shifted in from the right, Phase 1 and Phase 2 are repeated until the entire string has been compressed.

11. A system as in claim 2, wherein each of said systolic array of processors includes means to compare said selected pairs of data symbols to find a string of matching data symbols, means to compare the length of said matched string with the length of the longest matched string from a previous processor, means to provide an output indicating the longer of said two matched strings, and means to provide an output indicating the location of the processor with the longest matched string.

12. A system as in claim 11, wherein said means to compare said selected pairs of data symbols includes first comparator means.

13. A system as in claim 12, wherein said means to compare the length of said matched string with the length of the longest matched string from a previous processor includes second comparator means.

14. A system as in claim 13, wherein said means to provide an output indicating the longer of said two strings includes counter means.

15. A system as in claim 14, wherein said means to provide an output indicating the location of the processor with the longest match includes latch means.

16. A system as in claim 15, wherein each processor includes an id register, said id register having means to store identification information for the processor.

17. A system as in claim 16, wherein each processor in said systolic array of processors is connected to an adjacent processor.

18. A system as in claim 17, wherein each of said processors in said systolic array of processors includes delay means to delay said data symbols from one of said halves from being selectively passed to an adjacent processor.

19. A system as in claim 18, wherein said systolic array of processors comprises 128 processors.

20. A system as in claim 2, wherein each of said systolic array of processors includes means to compare said selected pairs of data symbols to find a string of matching data symbols, means to compare the length of said matched string with the length of the longest matched string from a previous processor, means to provide an output indicating the longer of said two matched strings, and means to provide an output indicating the location of the processor with the longest matched string, and wherein said storage locations in said symbol storage device have a preselected last location, said symbol storage device having means for providing a fixed length output from said last location indicating the data symbol in the storage location in the first half in the first level of the symbol storage device immediately following said longest string.

21. A system as in claim 21, wherein said maximum length of said codeword is three bytes long if said longest matched string is equal to or greater than three symbols in length, wherein one of said three bytes indicates the length of the longest string, a second of said three bytes indicates the starting point of said longest string and a third of said three bytes indicates the storage location in the first half of the symbol storage device immediately following said longest string.

22. A system as in claim 21, wherein said maximum length of said codeword is one byte long if said longest matched string is one symbol long, said one byte codeword indicating the storage location in the first half of the symbol storage device immediately following said longest string, and said maximum length of said codeword is two bytes long if said longest matched string is two symbols long, one of said two bytes in said codeword indicating the starting point of said longest string and a second of said two bytes in said codeword indicating the storage location in the first half of the symbol storage device immediately following said longest string.

23. A system for decompressing a coded string of data symbols forming codewords, comprising:
   a decompression codeword storage device having predetermined storage locations, said storage locations in said decompression codeword storage device having means to initially receive a string of predetermined data symbols and means to thereafter receive a codeword, said codeword having a length of a predetermined number of bytes with each byte having a predetermined number of bits, wherein one of said bytes of said codeword represents a pointer value, a second of said bytes of said codeword represents a length value, and a third of said bytes of said codeword represents a lastsymbol value,
   means to check a preselected bit in each byte of said codeword and means to shift a preselected number of locations in said decompression codeword storage device determined by the pointer value of said codeword if said preselected bit indicates that said longest matched string is equal to or greater than three data symbols in length, shifting into said storage locations preselected data symbols represented by the length value of said codeword, and shifting a data symbol into said decompression codeword storage device represented by the lastsymbol of said codeword,
   providing an output from said decompression codeword storage device indicating the original uncoded string of data symbols.

24. A method for parsing and coding a string of a variable number of uncoded data symbols to provide a codeword having a predetermined maximum length, comprising the steps of:

providing a symbol storage device having predetermined storage locations, said storage locations arranged into a first half and a second half, initializing the storage locations in the first half of the storage device with predetermined data symbols, inserting a string of uncoded data symbols into the storage locations in the second half of the storage device, comparing the data symbols in the storage locations in the second half of said symbol storage device with the data symbols in the storage locations in the first half of said symbol storage device using a systolic array of adjacent processors, providing an output from said systolic array of processors indicating: i) the length of the longest string of data symbols from the storage locations in the first half of said symbol storage device that matches a string of data symbols in the storage locations from the second half of said symbol storage device and ii) the location in the first half of said symbol storage device of the starting point for said string, shifting the data symbols of said longest string and the data symbol immediately following said longest string from the storage locations in the second half of said symbol storage device into the storage locations in the first half of said symbol storage device in a predetermined sequence and shifting subsequent uncoded data symbols into the storage locations in the second half of the storage device, providing an output from the first half of said symbol storage device indicating the data symbol that immediately follows said longest string, arranging the outputs from the systolic array of processors and the output from said symbol storage device in a codeword storage device, each of said outputs having a length of a predetermined number of bytes, wherein each of said bytes includes a predetermined number of bits, and setting one of said bits of said output from said symbol storage device to a predetermined first value if said longest string is less than three data symbols in length and storing said output from said symbol storage device in a temporary storage device, and setting said one of said bits in each byte of all of the outputs to a predetermined second value if said longest string is equal to or greater than three data symbols in length and storing the outputs from said systolic array of processors and said output from said symbol storage device in said temporary storage buffer.

25. A method for compressing and decompressing a string of a variable number of uncoded data symbols, comprising the steps of:

providing a symbol storage device having predetermined storage locations, said storage locations arranged into a first half and a second half, initializing the storage locations in the first half of the storage device with predetermined data symbols, inserting an uncoded string of data symbols into the storage locations in the second half of the storage device, comparing the data symbols in the storage locations in the second half of said symbol storage device with the data symbols in the storage locations in the first half of said symbol storage device using a systolic array of adjacent processors, said systolic array of processors providing an output indicating: i) the length of the longest string of data symbols in the storage locations in the first half of said symbol storage device that matches a string of data symbols in the storage locations from the second half of said symbol storage device and ii) the location in the first half of said symbol storage device of the starting point for said string, each of said outputs from said systolic array of processors and said symbol storage device having a length of a predetermined number of bytes, wherein each byte includes a predetermined number of bits, shifting the data symbols of said longest string and the data symbol immediately following said longest string from the storage locations in the second half of said symbol storage device into the storage locations in the first half of said symbol storage device in a predetermined sequence and shifting subsequent uncoded data symbols into the storage locations in the second half of the storage device, providing an output from the first half of said symbol storage device indicating the data symbol immediately following said longest string, arranging the outputs from the systolic array of processors and the output from said symbol storage device in a codeword and storing said codeword in a codeword storage device, each of said outputs having a length of a predetermined number of bytes, wherein each of said bytes includes a predetermined number of bits, setting one of said bits in each byte to a predetermined first value if said longest string is equal to or greater than three data symbols in length, moving said codeword in said codeword storage device to a temporary storage device, selectively retrieving said codeword from said temporary storage device, checking the value of said one bit in each byte of said codeword, shifting a preselected number of locations in a buffer determined by one of said bytes of said codeword if the value of said one bit indicates that said longest string is equal to or greater than three data symbols in length, shifting into said locations preselected data symbols represented by a second one of said bytes of said codeword, and shifting a data symbol into said buffer represented by a third one of said bytes of said codeword, said buffer providing an output indicating the original uncoded data symbols.

26. A method for decompressing a coded string of data symbols forming fixed-length codewords stored in memory, comprising the steps of:

inserting predetermined data symbols into a storage device, selectively retrieving a codeword from the memory, said codeword having a length of a predetermined number of bytes with each byte having a predetermined number of bits, wherein one of said bytes of said codeword represents a pointer value, a second of said bytes of said codeword represents a length value, and a third of said bytes of said codeword represents a lastsymbol value, checking a preselected bit in each byte of said codeword, shifting a preselected number of locations in said storage device determined by the pointer value of said codeword if said preselected bit indicates that said longest string is equal to or greater than three data symbols in length, shifting into said storage locations preselected data symbols represented by the length value of said codeword, and shifting a data symbol into said buffer represented by the lastsymbol of said codeword, providing an output from said symbol storage device indicating the original uncoded string of data symbols.

27. A method as in claim 26, further comprising the step of shifting each byte of said codeword directly into said storage device if said preselected bit of each byte indicates that said longest string is less than three data symbols in length.

28. A method as in claim 27, wherein the value of said preselected bit in each byte is checked by a code checker, said preselected bit being initially set to a first value if said longest string is equal to or greater than three data symbols in length, and initially set to a second value if said longest string is less than three data symbols in length.

29. A method as in claim 28, wherein said storage device comprises a semi-systolic array of processors.

30. An apparatus for parsing and coding a string of a variable number of uncoded data symbols into a codeword having a predetermined maximum length in a data compression system, comprising:

a symbol storage means having predetermined storage locations, said storage locations arranged into a first half and a second half, said storage locations in said first half having means to initially receive a string of predetermined data symbols, and said storage locations in said second half having means to receive a string of uncoded data symbols, a systolic array of processors which selectively receive data symbols from predetermined storage locations in each half of said symbol storage means, each of said processors having a first comparator which compares selected pairs of data symbols to determine the length of a string of data symbols in the data locations in the first half of the symbol storage means which match a string of data symbols in the storage locations in the second half of the symbol storage means, and a second comparator which compares the length of the matched string with the length of the matched string from an adjacent processor to determine the longest matched string, each processor passing the length of the longest matched string and the location in the first half of said symbol storage means of the starting point for the string, to an adjacent processor, said systolic array of processors providing fixed length outputs indicating: i) the length of the longest string of data symbols from the storage locations in the first half of said symbol storage means that matches a string of data symbols in the storage locations from the second half of said symbol storage means and ii) the location in the first half of said symbol storage means of the starting point for said string, said symbol storage means having means for shifting the data symbols of said longest string and the data symbol immediately following said longest string from the storage locations in the second half of said symbol storage means in a predetermined sequence into the storage locations in the first half of said symbol storage means and means for shifting subsequent uncoded data symbols into the storage locations in the second half of said symbol storage means, said symbol storage means having means for providing a fixed length output indicating the data symbol in the storage location in the first half of the symbol storage means immediately following said longest string, and a codeword storage means having means to receive said fixed length outputs from said systolic array of processing means and said fixed length output from said symbol storage means, said codeword storage means having means to provide a codeword having a predetermined maximum length indicating the length of said longest string, the starting point of said longest string and the data symbol immediately following said longest string.

* * * * *

UNITED STATES PATENT AND TRADEMARK OFFICE
CERTIFICATE OF CORRECTION

PATENT NO. : 5,179,378
DATED : January 12, 1993
INVENTOR(S) : N. Ranganathan; Selwyn Henriques It is certified that error appears in the above-identified patent and that said Letters Patent is hereby corrected as shown below:

Column 26, line 14, change "as in claim 21" to --as in claim 20--

Signed and Sealed this

Twenty-sixth Day of October, 1993

Attest:

BRUCE LEHMAN

Attesting Officer    Commissioner of Patents and Trademarks